(12) United States Patent
Zilic et al.

(10) Patent No.: US 8,024,691 B2
(45) Date of Patent: Sep. 20, 2011

(54) AUTOMATA UNIT, A TOOL FOR DESIGNING CHECKER CIRCUITRY AND A METHOD OF MANUFACTURING HARDWARE CIRCUITRY INCORPORATING CHECKER CIRCUITRY

(75) Inventors: Zeljko Zilic, Verdun (CA); Marc Boulé, Montréal (CA)

(73) Assignee: McGill University, Montreal (CA)

( * ) Notice: Subject to any disclaimer, the term of this patent is extended or adjusted under 35 U.S.C. 154(b) by 988 days.

(21) Appl. No.: 11/864,030

(22) Filed: Sep. 28, 2007

(65) Prior Publication Data

US 2008/0082946 A1    Apr. 3, 2008

Related U.S. Application Data

(60) Provisional application No. 60/827,358, filed on Sep. 28, 2006.

(51) Int. Cl.
*G06F 17/50* (2006.01)
(52) U.S. Cl. ............ 716/132; 716/55; 716/101; 703/14
(58) Field of Classification Search ............. 716/55, 716/101, 132
See application file for complete search history.

(56) References Cited

U.S. PATENT DOCUMENTS

| | | | |
|---|---|---|---|
| 6,975,976 B1 * | 12/2005 | Casavant et al. | 703/14 |
| 2003/0018461 A1 | 1/2003 | Beer et al. | |
| 2006/0031807 A1 | 2/2006 | Abramovici | |
| 2006/0085774 A1 | 4/2006 | Moorby | |
| 2006/0136879 A1 | 6/2006 | Singh et al. | |
| 2006/0190239 A1 | 8/2006 | Piper et al. | |

FOREIGN PATENT DOCUMENTS

WO    2006039637    4/2006

OTHER PUBLICATIONS

"IEEE Std 1850-2005—IEEE Standard for Property Specification Language (PSL)", Institute of Electrical Engineers Inc., New York, NY, USA, 2005, 153 pages.
Ben Cohen et al "Using PSL/Sugar for Formal and Dynamic Verification", VhdlCohen Publishing, Los Angeles, California, 2004, ISBN 0-9705394-6-0, Preface, Ch 1 (p. 1-26), Ch 4 (p. 147-186), Ch 7 (p. 229-277), Ch 9 (p. 313-334).
C. Eisner et al "A Practical Introduction to PSL", Springer-Verlag, New York, NY, USA 2006, ISBN 978-0-387-35313-5, 245 pages.
J. Hopcroft et al "Introduction to Automata Theory, Languages and Computation", Addison-Wesley, 2nd Edition, 2000, ISBN 0201441241, Preface, Chapters 1-4 (p. 1-167).
T. Kropf "Introduction to Formal Hardware Verification", Springer-Verlag, 1999, ISBN 978-3-642-08477-5, Preface. Chapters 1-4 (p. 1-204).

(Continued)

*Primary Examiner* — Thuan Do
(74) *Attorney, Agent, or Firm* — The Law Office of Michael E. Kondoudis

(57) ABSTRACT

The present invention relates to an automata unit, a tool for designing circuitry and/or checker circuitry, and a method for manufacturing hardware circuitry. The automata unit includes an input unit for receiving assertions using Boolean expressions, an automata generator for translating the assertions into automata, and an automata adaptor. The automata generator uses a dual layer symbolic alphabet for representing the assertions, and the automata adaptor adapts automata algorithms so as to support the symbolic alphabet in the generated automata. The tools for designing circuitry and checker circuitry rely on the automata unit, and further include an assertion unit and either a circuit generator or a checker generator.

5 Claims, 11 Drawing Sheets

OTHER PUBLICATIONS

R. McHaughton et al "Regular Expressions and State Graphs for Automata", IEEE Trans. Elect. Computers, EC-9(1), pp. 39-47, 1960.

D. Perry et al "Applied Formal Verification", McGraw-Hill, New York, NY, USA, 2005, ISBN 007144372X, 260 pages.

IEEE Std. 1850-2005. IEEE Standard for Property Specification Language (PSL). Institute of Electrical and Electronic Engineers, Inc., New York, NY, USA, 2005.

Ben Cohen, Srinivasan Venkataramanan, and Ajeetha Kumari. Using PSL/Sugar for Formal and Dynamic Verification. VhdlCohen Publishing, Los Angeles, California, 2004.

Cindy Eisner and Dana Fisman. A Practical Introduction to PSL. Springer-Verlag, New York, New York, 2006.

John Hopcroft, Rajeev Motwani, and Jeffrey Ullman. Introduction to Automata Theory, Languages and Computation. Addison-Wesley, second edition, 2000.

Thomas Kropf. Introduction to Formal Hardware Verification. Springer-Verlag, 1999.

Robert McNaughton and H. Yamada. Regular Expressions and State Graphs for Automata. IEEE Transactions on Electronic Computers, EC-9(1):39-47, 1960.

Douglas Perry and Harry Foster. Applied Formal Verification. McGraw-Hill,New York, New York, 2005.

* cited by examiner

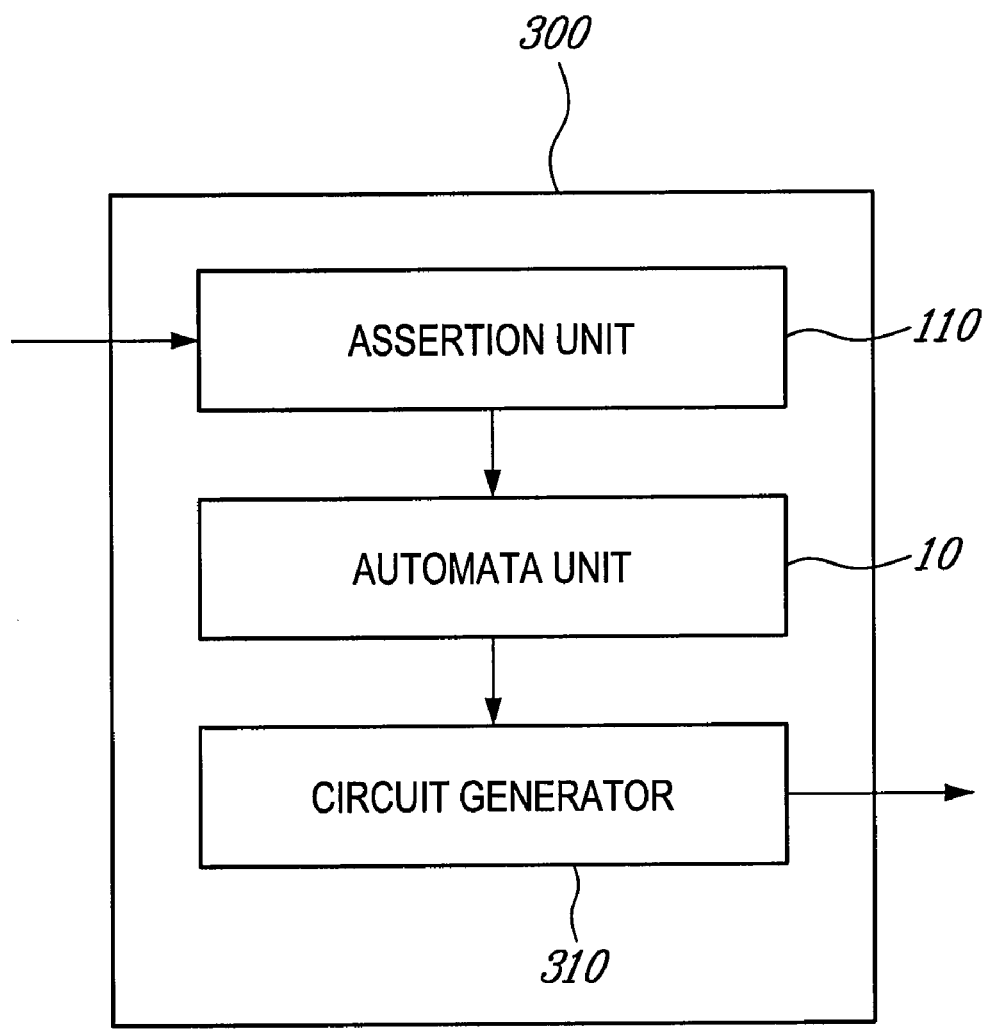

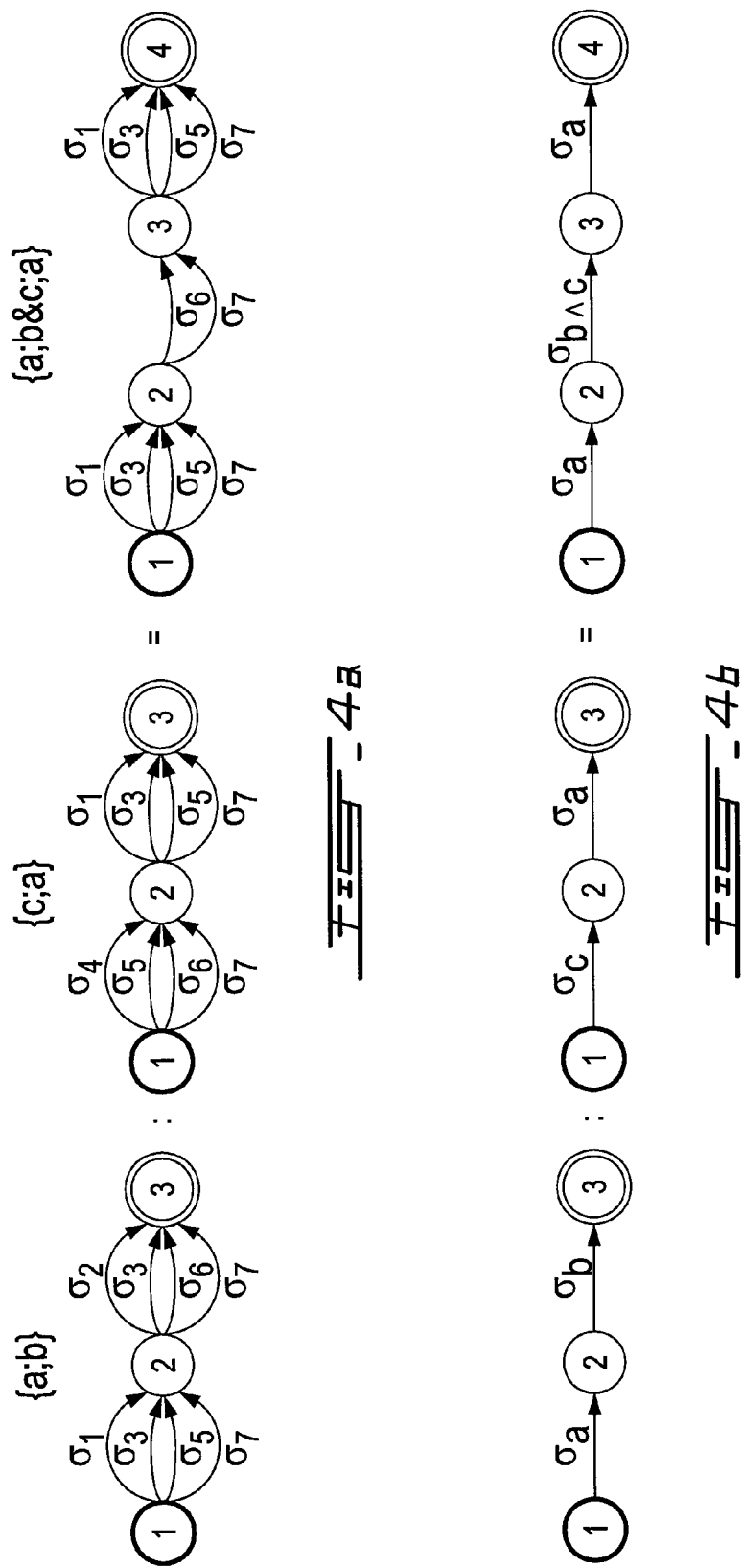

AUTOMATA UNIT, A TOOL FOR DESIGNING CHECKER CIRCUITRY AND A METHOD OF MANUFACTURING HARDWARE CIRCUITRY INCORPORATING CHECKER CIRCUITRY

FIELD OF THE INVENTION

The present invention relates to the field of hardware circuitry and more particularly to the field of generation, design and manufacturing of assertion checker circuitry.

BACKGROUND OF THE INVENTION

In 1965, Gordon Moore suggested the number of transistors in devices will approximately double every two years. This observation, widely known as Moore's Law, is still valid today. The pace of innovation of process technology has been nothing short of remarkable. The industry is currently working on 65 and 45 nanometer designs, enabling billion transistor devices. The size of the industry is equally impressive. The Semiconductor Industry Association estimated that sales for 2006 for integrated circuit devices would be over $207 Billion US and over $262 Billion by 2008. There seems to be no end to the demand for new and more complex products requiring integrated circuits.

Engineers use Electronic Design Automation (EDA) tools to develop and manufacture these devices. The complexity of millions and soon billions of transistors is clearly a task for computer-aided automation. In 2004, the market for these software tools was estimated to be over $4 Billion US and expected to grow at an annual rate of 10%.

These EDA tools are used to implement the design objectives from the initial abstract form of the circuit behavior to a final database which foundries use to manufacture devices. As a result of the increasing complexity, verifying that the design intent is faithfully implemented is becoming the dominant task within the overall project. The cost to design a new device is subject to many factors such as; re-use of IP (Intellectual Property) blocks, process technologies, complexity, and company specific overheads. In the International Technology Roadmap for Semiconductors (ITRS) 2005 Report on Design, the cost of a 6.5 million logic gate System on Chip was estimated to be close to $20 millions US.

Therefore, producing error-free Integrated Circuits (ICs) is of paramount importance in the semiconductor industry. In some cases the importance is of an economic nature, as product recalls and loss of market shares are but some of the consequences of providing faulty circuits. In military and aerospace applications, the consequences can be more direct especially when human lives enter the equation. Examples of defects in ICs range from satellite and rocket malfunctions, to glitches and failures in consumer applications. One well-known case is the floating-point error found on early models of the Pentium processor by Intel. This "bug", known as the FDIV bug was not a fabrication or manufacturing defect, but rather a functional error in the design of the division algorithm.

Verification aims to ensure that a circuit design behaves according to its intended specification. Verification deals with functional errors in circuit designs, in contrast to testing which deals with the detection of fabrication errors in ICs. In today's complex hardware digital circuit designs, verification typically requires more effort than the actual design phase itself. The predominant current verification methodology is based on an ad-hoc simulation-based approach, sometimes aided with coverage metrics. The design is verified by building a series of models, selecting test vectors, simulation and troubleshooting the resulting errors. This can be considered a post design approach. Although a large number of simulations can be run, the effort spent in fixing the bugs does not resolve the question of whether the design is faithful. A heavy burden is placed on design teams to prioritize which design areas need special attention and to identify events which could trigger a catastrophic failure. For those reasons, the ITRS suggests that without new techniques, verification will be a barrier for progress in the industry.

Amongst others, one technique, Assertion Based Verification (ABV) is emerging as a powerful approach for designers. This approach allows for a precise description of the expected behavior of the system to be modeled using temporal logic. Deviation from the expected behavior can be captured during simulations or by formal methods. Recently, the Institute of Electrical and Electronics Engineers (IEEE) adopted two languages for assertion specification; Property Specification Language (PSL) developed by IBM™ and Accellera™ (IEEE-1850) and System Verilog™ (IEEE-1800), accelerating its adoption.

After errors have been identified, the next step is to debug the design. Like finding the proverbial needle in the haystack, debugging increasingly complex devices can easily become a roadblock to delivering the end product on time.

Other vendors' products support assertions in multiple languages and allow for circuit emulation. These systems are substantial investments and form part of each company's comprehensive EDA portfolio.

In the emerging DFD (Design For Debug) space, companies are promoting a range of solutions. One such solution enables the designers to select an instrumentation structure, which can be synthesized and used post fabrication for debugging.

Hardware verification aims to ensure that a design fulfills its given specification by either formal or dynamic (simulation based) techniques. As one facet of Assertion-Based Design, Assertion-Based Verification (ABV) is quickly emerging as the dominant methodology for performing hardware verification in practice. Using temporal logic, a precise description of the expected behavior of a design is modeled, and any deviation from this expected behavior is captured by simulation or by formal methods. Hardware assertions are typically written in a verification language such as PSL (Property Specification Language) or SVA (SystemVerilog Assertions). When used in dynamic verification, a simulator monitors the Device Under Verification (DUV) and reports when assertions are violated. Information on where and when assertions fail is an important aid in the debugging process, and is the fundamental reasoning behind the ABV methodology. Assertion-Based Design practices also advocate the use of assertions as part of the design effort, when used as a formal documentation language. Assertions even go beyond design and verification, when used with a checker generator. In such cases, circuit-level checkers can be produced to create permanent circuitry that is to be added to a design, in order to perform silicon monitoring for self-test and diagnostic purposes, during the lifespan of the IC.

As circuits become more complex, hardware emulation is becoming an increasingly important asset for verification. Hardware emulation achieves the traditional dynamic verification goals by loading and executing the circuit on a reprogrammable hardware substrate, typically on an array of programmable logic devices. Once implemented in hardware, the emulator fully exploits the inherent circuit parallelism, as opposed to performing a serial computation in a simulation kernel. Furthermore, when design errors are found during emulation, additional information from the assertion checkers should be used to point to the source of the problem.

Assertion languages allow the specification of expressions that do not lend themselves directly to hardware implementations. Such languages allow complex temporal relations between signals to be stated in a compact and elegant form. In order to consolidate assertion-based verification and emulation, a checker generator is used to generate hardware assertion checkers. A checker generator is the tool that transforms assertions into assertion monitor-circuits (checkers), directly usable in hardware emulation. The overall operation of a checker generator is illustrated in FIG. 8, using a simple example scenario. A checker generator allows the flexibility of automatically generating custom monitor circuits from any assertion statement. Coding checkers by hand can be a tedious and error-prone task. In certain cases, a single PSL statement can imply tens or even hundreds of lines of RTL code in the corresponding checker.

Individual assertions, once converted to circuit form, are also referred to as assertion circuits. These checker circuits are typically expressed in a Hardware Description Language (HDL). An assertion checker is a circuit that captures the behavior of a given assertion, and can be included in the DUV for in-circuit assertion monitoring.

The concept of checker generators for PSL was pioneered by IBM™ and their FoCs tool as described in AlphaWorks, FoCs Property Checkers Generator, version 2.04, available on www.alphaworks.ibm.com/tech/FoCs, 2007. The original assertion language that served as the foundation for PSL was actually developed by IBM™ and was called Sugar™. The FoCs tool was originally intended for simulation use; however, the circuit checkers that were produced could also be synthesized in hardware.

SUMMARY OF THE INVENTION

In a first aspect, the present invention relates to an automata unit including an input unit, an automata generator and an automata adaptor. The input unit is adapted for receiving assertions using Boolean expressions. The automata generator is adapted for translating the assertions into automaton, the automata generator uses a symbolic alphabet for representing the assertions on a dual layer. The automata adaptor adapts automata algorithms so as to support the symbolic alphabet in the generated automaton.

In another aspect, the present invention relates to a tool for designing circuitry. The tool comprises an assertion unit, an automata unit and a circuit generator. The assertion unit is adapted for entering assertions corresponding to an expected behavior of at least a portion of a circuit. The assertion unit relies on Boolean expressions. The automata unit is adapted for generating automata, each automaton corresponding to at least a portion of one of the assertions. The automata unit uses a symbolic alphabet to represent the assertions and adapts automata algorithms so as to support the symbolic alphabet in the generated automata. The circuit generator is adapted for designing circuitry corresponding to each automaton for the at least one portion of the circuit.

In another aspect, the present invention relates to a tool for designing checker circuitry. The tool includes an assertion unit, an automata unit and a checker generator. The assertion unit is adapted for entering assertions corresponding to an expected behavior of at least a portion of a circuit. The assertion unit relies on Boolean expressions. The automata unit is adapted for generating automata, each automaton corresponding to at least a portion of one of the assertions. The automata unit uses a symbolic alphabet to represent the assertions, and adapts automata algorithms to support the symbolic alphabet in the generated automata. The checker generator is adapted for designing checker circuitry corresponding to each of the automata for the at least one portion of the circuit.

In yet another aspect, the present invention relates to a method of manufacturing hardware circuitry. More particularly, the method has steps for: specifying assertions corresponding to an expected behavior, using an assertion language; defining symbol encoding and optimizations for Boolean expressions in said assertions, for subsequent use in automaton form; converting said assertions into finite automata using said symbol encoding, whereby at least sub portions of said automata are nondeterministic; using said automata, combined with traditional circuitry, to design said checker circuitry; and implementing said checker circuitry.

BRIEF DESCRIPTION OF THE DRAWINGS

FIG. 3 is a block diagram of a tool for designing circuitry in accordance with another aspect of the present invention;

FIG. 4 shows the effect of alphabet choice on automata using a) power set alphabet, and b) symbolic alphabet in accordance with the present invention;

DETAILED DESCRIPTION OF THE INVENTION

The Industry Context

Figure 1:
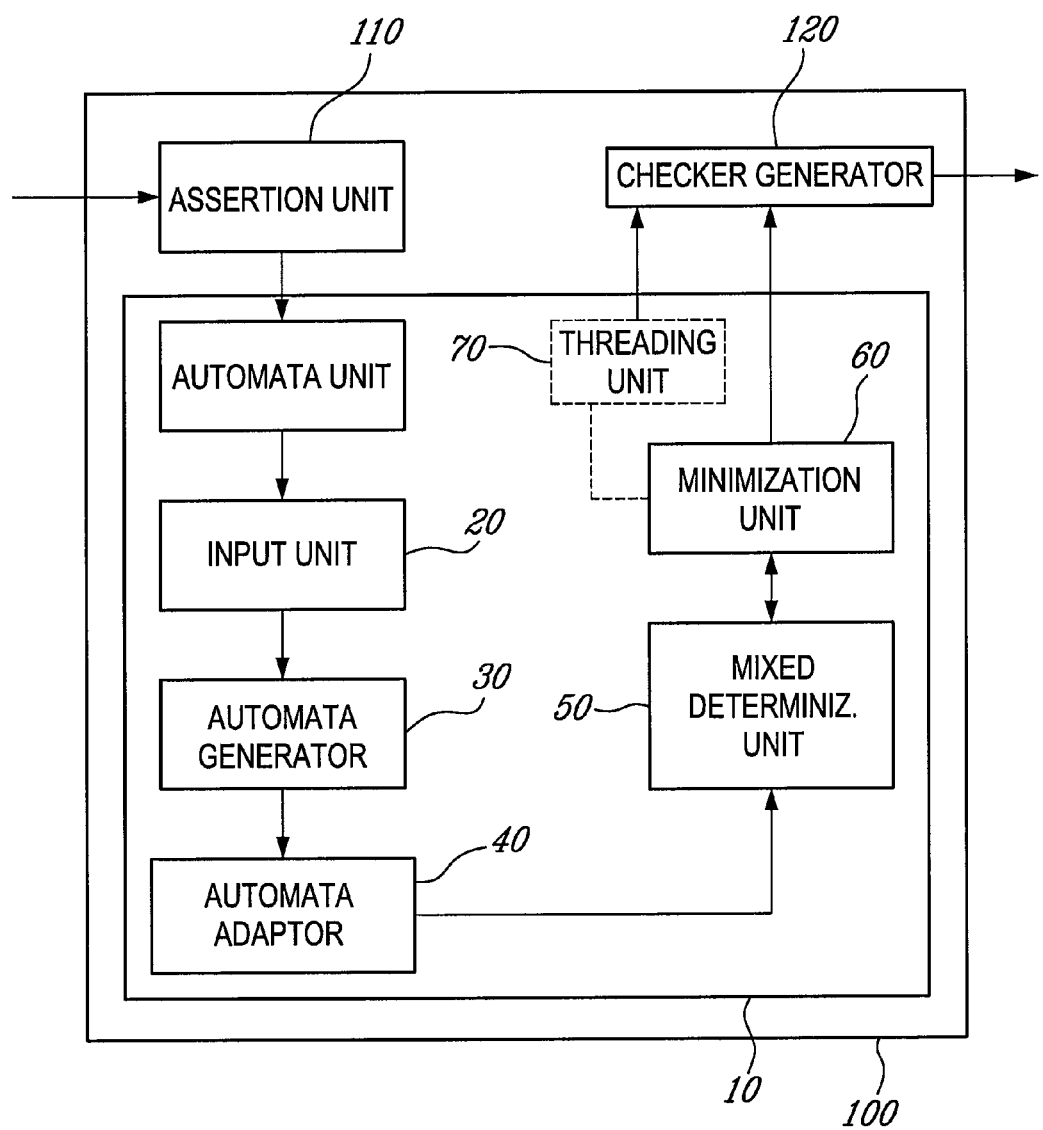
FIG. 1 is a block diagram of an automata unit embedded within a tool for designing checker circuitry in accordance with an aspect of the present invention.

In typical circuit designing, after errors have been identified by simulation, the next step is to debug the design. Like finding the proverbial needle in the haystack, debugging increasingly complex devices can easily become a roadblock to delivering the end product on time. To address this issue, a number of companies and researchers have proposed solutions, which provide deeper on-chip observability and have formed an industry organization, Design for Debug (DFD) to promote this market segment. In line with these goals, the present invention provides increased activity monitoring and observability during the debugging stage. Furthermore, if checkers circuitry is incorporated in the final circuit design, in-circuit diagnostic routines can be implemented during field deployment. This represents a significant value-added feature for systems in mission critical environments.

The leading Field Programmable Gate Arrays (FPGA) device vendors, Altera™, Xilinx™, Lattice™ and Actel™, all offer emulation boards for designers to prototype and verify their designs. Integrating the present tool, which creates resource efficient assertion circuits, allows users of their implementation tools to emulate large circuits along with their assertions.

Checker generation is typically part of multi-million dollar emulation systems, by Cadence™, for example; however a simple tool to generate efficient assertion checkers is required. This can benefit smaller single end-users who wish to develop home-brewed emulation using assertions. The tool of the present invention could also be integrated to larger simulation-accelerators and general-purpose hardware emulators. In its current version, the tool of the present invention has in simulations outperformed the only other known stand-alone checker generator in many aspects of checker generation (synthesizability and size of generated circuits, number of PSL operators supported, correctness, etc.).

The automata that are typically produced in the state of the art are for model checking, and can also be utilized to check a property during simulation. These types of checkers are meant to indicate the status of the property at the first failure or at the end of execution only. This is not ideal for debugging purposes; it is more informative to provide a continual dynamic trace of the assertion and to signal each assertion failure instance: having a choice of violations to explore eases the debugging process, as some errors may reveal more than others. All the algorithms described in this text are implemented in the tool of present invention implemented under the product name MBAC. The tool of the present invention and the circuits it produces are geared towards dynamic assertion based verification.

Definitions

The following paragraphs provide definitions for many of the expressions and concepts used in the present specification.

The two main classes of design verification are dynamic verification and static verification. Static verification is typically associated to formal verification, and is performed by tools such as automated theorem provers and model checkers. The term static is indicative of the fact that the circuit under verification does not need to be exercised.

A string is a sequence of symbols from an alphabet $\Sigma$, including an empty string, denoted as $\epsilon$. A regular expression RE is a pattern that describes a set of strings, or a language of RE, denoted L(RE). For example, if the alphabet consists of the ASCII characters, regular expressions efficiently represent a set of strings that can be searched for in string matching. Regular Expressions (REs) and their corresponding languages are described as follows, where r is a regular expression:

a symbol $\alpha$ from $\Sigma$ is a RE; $L(\alpha)=\{\alpha\}$ $\epsilon$ and $\emptyset$ are REs; $L(\ )=\{\epsilon\}$ and $L(\emptyset)=\emptyset$ $r_1|r_2$ is a RE; $L(r_1|r_2)=L(r_1) \cup L(r_2)$ (set union)

$r_1;r_2$ is a RE; $L(r_1;r_2)=L(r_1)L(r_2)$ (set concatenation)

$r_1^*$ is a RE; $L(r_1^*)=(L(r_1))^*$ (Kleene closure).

The Kleene closure (Kleene star) is an operator that creates the strings formed by concatenating zero or more strings from a language. Parentheses can also be used for grouping, and as usual, $\emptyset$ denotes the empty set. It should be noted that $L(\epsilon) \ne L(\emptyset)$, as the former describes a non-empty language formed by the empty string, whereas the latter describes the empty language.

A regular expression's language can be captured equivalently, in a form suitable for computation, by a finite automaton that accepts the same language.

A classical Finite Automaton (FA) is described by a quintuple $A=(Q, \Sigma, \delta, q_0, F)$ as follows:

Q is a non-empty set of states;
$\Sigma$ is the alphabet;
$\delta \subset Q \times \{\Sigma \cup \{\epsilon\}\} \times Q$ is the transition relation;
$q_0$ is the initial state;
$F \subset Q$ is the set of final states.

The non-empty set Q is a finite set of locations (states). The alphabet $\Sigma$ is the same alphabet that was described above for regular expressions. A transition (or edge) is represented by an ordered triple (s, $\sigma$, d), and the transition relation consists in a subset of triples: $\{(s, \sigma, d) | s \in Q. \sigma \in \{\Sigma \cup \{\epsilon\}\}, d \in Q\}$. The transition relation is sometimes expressed as the mapping $Q \times \{\Sigma \cup \{\epsilon\}\} \to 2^Q$. The transition relation indicates which destination state(s) to activate, for each state and for each input symbol that is received. The transition relation does not need to be complete and a state does not always have to activate other states.

Identifiers s and d refer to the source and destination states of an edge, respectively. An edge also carries a symbol $\sigma$ taken from the alphabet $\{\Sigma \cup \{\epsilon\}\}$. If an edge carries the symbol, then the state transition is instantaneous. When matching against an input string, no input symbol needs to be processed for a transition to take place. For a non-edge whose source state is active, a given transition takes place when the input symbol is identical to the edge's symbol.

The automaton has a single initial state. When the pattern matching begins, this is the only active state. A subset of states can also be designated as final states. When a final state is active, the pattern described by the automaton has been matched. Final states are also called accepting states, and they can be seen as accepting the language modeled by the automaton.

The automaton represents a pattern matching machine that detects all strings that conform to the language represented by the automaton. In other words: if A is an automaton built from a regular expression r, then $L(r)=L(A)$. More generally, the input string in pattern matching is called a word, and an element of the word is called a letter. The alphabet's symbols are all mutually exclusive and one and only one letter is processed at a time by the automaton. At each step the automaton transitions into a new set of active states.

The convention used in this work is to represent the initial state using a bold circle and final states using double circles. A regular expression is converted into an equivalent automaton in a recursive manner. First, terminal automata are built for the symbols of the regular expression, as shown in part a). The empty automaton and the null automaton are acceptors for the languages $L(\epsilon)$ and $L(\emptyset)$ respectively. Next, these terminal automata are inductively combined according to the operators comprising the given RE. The Kleene closure of an automaton is created by adding edges for bypassing the automaton (empty matching), and re-triggering the automaton (multiple consecutive matches). Choice and concatenation of two argument automata involve combining the automata using edges. The construction procedure described above, called the McNaughton-Yamada construction, produces a Nondeterministic Finite Automaton(NFA) containing transitions. An automaton can be determinized, hence producing a deterministic finite automaton (DFA).

An automaton with a single initial state and no transitions, and where no state can simultaneously transition into more than one successor state is a Deterministic Finite Automaton (DFA), otherwise it is a Nondeterministic Finite Automaton (NFA).

A corollary can be made for classical automata, where the alphabet symbols are mutually exclusive entities that are received one at a time by the automaton, and thus no two symbols can occur at once.

A classical FA is a Deterministic classical FA when it has a single initial state and no transitions, and when no more than one outgoing edge from a given state carries the same symbol, otherwise it is a Nondeterministic classical Finite Automaton.

A DFA for which every state transitions into precisely one successor state at each step is a complete DFA.

The corollary of completeness in the case of classical automata follows naturally. A classical FA in which every state has one outgoing transition for every symbol is said to be a complete classical DFA.

For classical automata, the corollaries have the same effect as their related definitions. However for assertion automata, where the symbol alphabet is not mutually exclusive, the corollaries are not strong enough.

Subset construction is the central procedure in the determinization algorithm. In a deterministic automaton, at most one outgoing transition must take place in a given state, for a given symbol. In order for multiple outgoing transitions with the same symbol to activate a single destination state, a state in the DFA represents a subset of states of the NFA. This way, the criterion for single destination states is respected. Subset construction yields a DFA that has in the worst case an exponential number of states compared to the original NFA. The following example illustrates the conversion of an NFA with transitions into an equivalent DFA.

An operator that does not usually appear in the definition of REs is complementation. If r is a regular expression and A is the equivalent automaton, and L(A) is the language accepted by the automaton (hence L(r) also), then the complemented automaton Ā accepts the language !L(A), where $!L=\Sigma^*-L$. The full language $\Sigma^*$ represents every possible string that can be formed using the alphabet $\Sigma$. The complemented automaton Ā can be computed from A using the following algorithm:

1. Determinize A;

2. Make A complete;

3. Complement the final states: $F \leftarrow Q-F$.

Another operator not typically used in regular expressions is intersection. If $r_1$ and $r_2$ are REs, then $r_1 \&\& r_2$ is a RE, where $L(r_1 \&\& r_2)=L(r_1) \cap L(r_2)$. The $\cap$ symbol represents set intersection. The double ampersand notation was chosen here to more closely relate to the length matching intersection operator found in PSL. The intersection of two regular expressions corresponds to the strings that are in both languages of the REs. It should be noted that the intersection and complementation of regular languages also yield regular languages. In automaton form, the intersection operator is implemented by building a product automaton from both argument automata. This product automaton is built by simultaneously traversing both argument automata and exploring all paths that have common symbols. In the product construction, a state is labeled using an ordered pair (i,j) where i represents a state from the first argument automaton and j is a state in the second automaton. The algorithm starts by creating an initial state that references both initial states in the input automata. From there, all transitions with a given symbol that simultaneously advance both automata are explored and used to construct new states and edges in the product automaton. A new state is a final state only if both referenced states are final states in their respective automata. In the worst case, the product construction can create an automaton with O(mn) states, where m and n are the number of states in both argument automata.

Introduction to Assertions

Assertions are additional statements that are added to a design to specify its correct behavior. Assertions have been used in software for many decades, and only in the last decade have they made a widespread impact in hardware design. In hardware, assertions model the correct behavior of the design using properties specified in temporal logic.

Assertions can also be seen as a formal documentation language, free of the ambiguities inherent to English language specifications. In another view, assertions can be seen as an executable specification, or a computable specification, when interpreted by verification tools. Once the assertion language is learned, adding assertions to a design represents a low overhead way to perform verification since assertions are text-based commands.

Assertions are typically processed by simulators in dynamic verification, or by model checkers and theorem provers in static verification. When large designs are to be simulated, they are often emulated in hardware where the implicitly parallel nature of digital circuits can be exploited for faster run-times. To allow assertions to be used in hardware, a checker generator is required to transform the assertions into circuit-level checkers. Assertions are written in high-level languages and are not suitable for direct implementation in circuit form.

Improvements to Assertions

Assertion languages such as PSL and SVA are built using Boolean expressions, sequential-extended regular expressions (SEREs) for describing temporal sequences, and higher-level properties. The present invention introduces the algorithms for transforming SEREs, properties and complete assertions into resource efficient circuits suitable for hardware emulation, and demonstrates their applicability within the complete tool. The implementation is based on automata theory and rewrite rules. Synthesizing resource-efficient assertion checker circuits is crucial for emulation because the assertion checking circuits compete with the DUV for resources in an emulator. Ideally, assertion circuits should be compact, fast, and should interfere as little as possible with the DUV, with which it shares the emulator resources. Since many themes are common to other assertion languages, the presented techniques are not restricted to PSL.

Aspects of the Present Invention

Utilizing classical automata theory directly for pattern matching over Boolean propositions implies a power set symbol mapping that can impose a high penalty on the number of edges required in the automata. For this reason, the present invention provides for a symbolic alphabet that will be used as the alphabet. This is not without consequence however, as many of the conventional automata algorithms cannot be used with a symbolic alphabet. The problem is that conventional RE pattern matching is defined upon a mutually exclusive symbol alphabet, where one and only one symbol is received at each step. This is not the case with Boolean expressions, which can simultaneously and independently evaluate to true. Modifications to well established automata algorithms are thus necessary for operators that are common both to REs and SEREs. For other operators that are not used in SEREs, special algorithms are devised, also taking under consideration the symbolic alphabet.

More particularly, the introduction of the symbolic alphabet, hereinafter referred to as the dual layer symbolic alphabet, has effects on conventional automata algorithms such as determinization and minimization. The present invention thus provides a tool for generating smaller automata, so that when expressed as a circuit, the generated assertion checkers utilize fewer hardware resources, and are implemented less obtrusively in FPGAs or ASIC hardware.

The checker circuitry produced by the present invention provides a single result signal for each assertion and is thus simple to monitor. As in FoCs, the present invention uses a special end-of-execution (EOE) signal for implementing temporally strong properties. This signal marks the end of time and obligations that were not fulfilled cause the assertion signal to trigger.

Since the present invention implements entire assertions as automata, optimizations that cannot be seen across module boundaries, can be seen in automaton form, and thus helps produce minimized checkers.

The present invention also presents techniques by which assertion checkers synthesized from PSL are enhanced with several key debug features: hardware coverage monitors, activity monitors, assertion completion and assertion threading. The added circuitry can significantly improve the debugging capabilities of the resulting checkers at the expense of a slight increase in the assertion-circuit size.

Elaboration of automata that offer appropriate behavior for use in dynamic assertion-based verification in the context of hardware implementations, for which the main goals are minimal hardware, optimal user feedback and high circuit speeds rely on some or all of the following aspects:

a. Implementation of mapping of automata into circuits in order to create checkers suitable for dynamic verification, including hardware implementations, such as in hardware emulation, simulation acceleration, silicon debug and in-field diagnostics.

b. Implementation of automata algorithms under the symbolic encoding.

c. Development of "primary" and "extended" symbol tables for the automata edge symbols, and incorporation of top-level negations of Boolean expressions into the symbol tables, thereby allowing further minimization of automata by Boolean edge simplifications. The "true" symbol also receives special treatment for minimalism.

d. Development of the concept of mixed determinization: sub-automata for certain types of sequences are kept weakly deterministic (i.e. nondeterministic) in the hardware implementation, allowing increased hardware efficiency.

e. Introduction and implementation of debug enhancements to hardware checkers: signal dependencies, sequence activity, assertion and cover counters, completion mode (first-match algorithm), and assertion threading. The first-match algorithm can also be used to implement the SVA (SystemVerilog™ Assertions) operator of the same name.

f. Introduction of rewrite rules for implementing most properties, rules which are appropriate for dynamic verification in any tool (even those that do not use automata).

g. Introduction of a full automaton approach for base PSL properties, including two different recursive mechanisms: #1) parent assembles automata (simple and elegant); #2) child assembles automaton because it is given a precondition automaton by its parent, necessary for efficient form of "eventually!" operator, and for many debug enhancements. Full automaton allows optimizations not possible in modular form.

h. Introduction of an efficient implementation of the "eventually!" operator that must go beyond the bounds of automata, and into full circuits.

Terminology Particularities

Although the present invention has been developed using Property Specification Language (PSL), persons skilled in the art will recognize that it is equally applicable to other similar languages. PSL has been used in some particular examples described herein below as it is studied and used as the standard hardware assertion language. A few key advantages associated to PSL are listed below:

PSL was the first hardware assertion language to receive IEEE standardization (IEEE-1850);

With the use of many flavor macros, PSL offers a language independent means of specifying assertions, and can be used in VHSIC Hardware Description Language™ (VHDL) where VHSIC means Very High Speed Integrated Circuit, Verilog, ™ SystemVerilog™, General Description Language (GDL) and SystemC™ designs;

PSL incorporates many temporal operators found in formal verification and model checking, such as Linear Temporal Logic (LTL) and Computation Tree Logic (CTL), and is therefore well positioned to serve both the formal verification community and dynamic verification scenarios (ex: simulation).

Furthermore, reference is also made to Verilog™ language herein below as the underlying language for expressing circuit designs, thus the Verilog flavor of PSL will be used throughout. However, those skilled in the art than any similar language could be used, without departing from the scope of the present invention, and that Verilog™ is being used throughout as exemplary purposes only.

Additionally, the present invention has been implemented using the Property Specification Language, although the key ideas presented in this paper apply equally to SVA or other modern assertion languages. While there are several modern assertion languages, our tool currently uses PSL (IEEE 1850 Standard), which is arguably the most complex. PSL sequences have a strong similarity with SVA sequences, and with any regular-expression based sequence definition in assertion languages, thus these techniques are not restricted to PSL. This also applies to properties, like suffix implication for example, which are also common across different assertion languages.

An Automata Unit

In a first aspect, the present invention relates to an automata unit 10, as shown on the block diagram of FIG. 1. The automata unit 10 is depicted embedded within a tool for generating checker circuitry 100, but is a stand-alone unit. The automata unit 10 includes an input unit 20, an automata generator 30, an automata adaptor 40, a mixed determinization unit 50, and a minimization unit 60. The input unit 20 is adapted for receiving assertions using Boolean expressions.

The input unit 20 may receive the assertions from an assertion unit 110, as code from an assertion compiler (not shown), or from any other means capable of producing assertions using Boolean expressions. The input unit then forwards the received assertions to the automata generator 30 for translating the assertions into automata. The automata generator 30 uses a dual layer symbolic alphabet for representing the assertions. The symbolic alphabet will be described in greater details further. The translated assertions are then forwarded to the automata adaptor 40, which adapts automata algorithms so as to support the symbolic alphabet in the generated automaton and generates one or multiple automata based on translated assertions using the adapted automata algorithms. The adaptation of the automata algorithms will be described in detail in subsequent sections. The automata are then sent to the mixed-determinization unit 50 for determining whether some parts of the automata can be reduced, and if so proceed with reducing the size of the automata. Finally, the automata are then provided to the minimization unit 60 for evaluating whether the generated automata, in view of the symbolic alphabet, can be further reduced. The reductions performed in the mixed determinization unit 50 and the minimization unit 60 will be described in respective sections herein below. In an alternate embodiment of the present invention, the automata unit is further equipped with a threading unit 70, which adapts the automaton for further allowing tracking complex temporal chains of events of the expected behavior. The threading functionality will be further described in greater detail.

Tool for Generating Checker Circuitry

In another embodiment, the present invention relates to a tool and a method for designing checker circuitry. The tool for designing checker circuitry is shown on FIG. 1. The tool 100 includes an assertion unit 110, an automata unit 10 and a checker generator 120. The assertion unit 110 is adapted for entering assertions corresponding to an expected behavior of at least a portion of a circuit (not shown). The assertion unit 110 relies on Boolean expressions. The assertions are then provided to the automata unit 10 for generating automata. Each automaton corresponds to at least a portion of one of the assertions. The automata unit 10 uses a symbolic alphabet to represent the assertions, and adapts automata algorithms to support the symbolic alphabet in the generated automata. The generated automata are then provided to the checker generator 120 for designing checker circuitry corresponding to each automaton for the at least one portion of the circuit.

Figure 2:
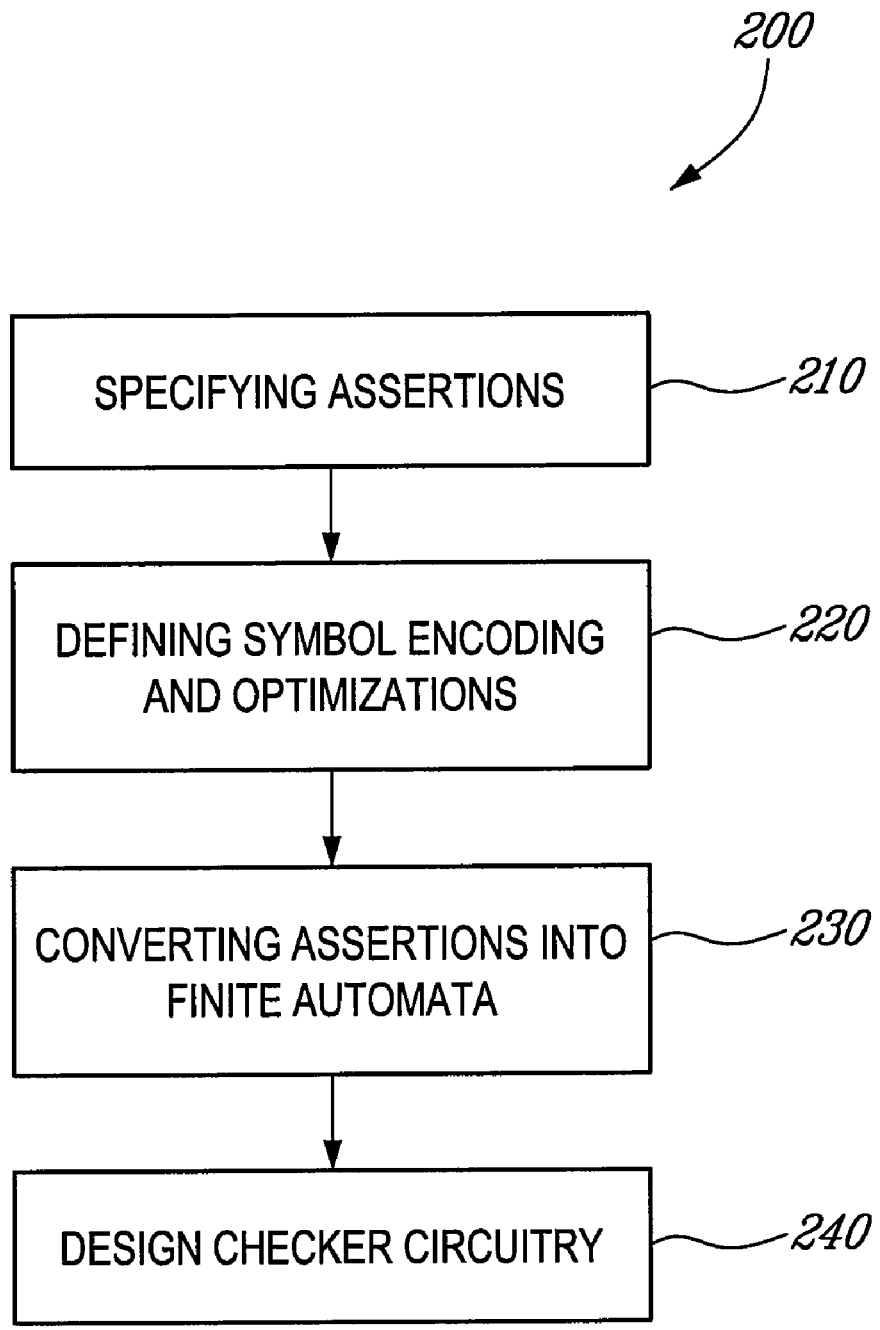
FIG. 2 is a flow diagram of a method for designing checker circuitry in accordance with another embodiment of the present invention.

Correspondingly, the method for designing checker circuitry is generally depicted in FIG. 2, which is a flowchart of the steps of the method. The method 200 starts with a step of specifying assertions 210 corresponding to an expected behavior, using an assertion language. Examples of assertion languages have already been previously discussed. The method then continues with a step of defining symbol encoding and optimizations 220 for Boolean expressions in said assertions, for subsequent use in automaton form. Afterwards, the method proceeds with a step of converting 230 said assertions into finite automata using said symbol encoding, whereby at least sub portions of said automata are nondeterministic. The method pursues with a step of using said automata, combined with traditional circuitry, to design 240 said checker circuitry. Additionally, if desired, the method may further include a step of implementing said checker circuitry (not shown).

Tool for Designing Circuitry

In another embodiment, the present invention also relates to a tool for designing circuitry 300. The tool for designing circuitry 300 includes the assertion unit 110 for entering assertions corresponding to an expected behavior of at least a portion of a circuit to be designed. The assertion unit 110 relies amongst other things on Boolean expressions. The tool for designing circuitry 300 further includes the automata unit 10 for generating automata. Each automaton corresponds to at least a portion of one of the assertions. The automata unit 10 uses symbolic alphabet to represent the assertions, and adapts automata algorithms so as to support the symbolic alphabet in the generated automata. The tool for designing circuitry 300 further includes a circuit generator 310 for designing circuitry corresponding to each automaton for the at least one portion of the circuit.

In a preferred embodiment, the assertion unit 110 relies on a high-level expressiveness assertion language. Such high-level expressiveness assertion language facilitates the work of designers as the assertions provided to the assertion unit 110 may also correspond to spoken language. Furthermore, the tool for designing circuitry is adapted to automatically design circuitry from the expected behavior provided as assertions to the assertion unit 110. The means for such automatic circuitry design will be discussed further.

Dual-layer Symbolic Alphabet

The automata for assertion checkers are not defined over a mutually exclusive alphabet. In order to use the defined automaton formalism for the case of Booleans, the power set alphabet is traditionally used.

The power set alphabet corresponds to all the possible valuations of the Booleans used in an assertion. If there are B Booleans, it follows that the cardinality of the alphabet is $|\Sigma|=2^{|B|}$.

When an assertion references many Booleans, the exponential increase in the numbers of symbols and edges make this approach difficult to scale. The advantage of the power set alphabet is that symbols become mutually exclusive, and conventional automata algorithms can be used directly; the framework becomes analogous to conventional string matching where one and only one character is received at a time. In sum, the power set alphabet brings the non-mutually-exclusive Booleans into the realm of the mutually exclusive symbols of traditional pattern matching. The disadvantage is that an exponential number of edges are required to model a transition.

To avoid the exponential number of edges required in the power set alphabet, the present invention provides for a symbolic alphabet. The symbolic alphabet corresponds to a direct mapping of the Booleans used in an assertion, such that each symbol represents a given Boolean directly.

Although simple in appearance, this alphabet is not mutually exclusive and requires special modifications to algorithms such as intersection and determinization. In the symbolic alphabet, edge symbols represent complete Boolean-layer expressions that are not mutually exclusive because any number of separate expressions can simultaneously evaluate to true. This creates nondeterminism because a given state may transition to more than one state. While adding inherent nondeterminism in this alphabet, certain determinizations throughout the operations on automata can be avoided, which helps create smaller automata.

The alphabet stated above is only partially complete, and may grow as new symbols are required. The following example based on sequence fusion illustrates the fundamental differences between the two alphabet approaches, and the effects on the number of edges required.

The fusion of two example sequences defined from Booleans a, b and c follows: {a;b}:{c;a}.

The following table shows how the power set alphabet is defined for this example. The symbolic alphabet is also shown; however, before the fusion is actually performed, only the symbols $\sigma_a$, $\sigma_b$ and $\sigma_c$ exist. In the table ^ is Boolean conjunction v is disjunction, T is short for true and F is false. In the power set alphabet (left), only one line (symbol) is active at any given time, thus four symbols (and edges) are required to model a transition for a given Boolean; in the symbolic alphabet, only one symbol is required. For example, to model a transition on Boolean b in the power set alphabet, four edges are required for symbols $\sigma_2$, $\sigma_3$, $\sigma_6$ and $\sigma_7$.

| c | b | a | Power set alphabet | Symbolic alphabet |
|---|---|---|---|---|
| F | F | F | $\sigma_0$ | $\sigma_a = a$ |
| F | F | T | $\sigma_1$ | $\sigma_b = b$ |
| F | T | F | $\sigma_2$ | $\sigma_c = c$ |
| F | T | T | $\sigma_3$ | $\sigma_{b \wedge c} = b \wedge c$ |
| T | F | F | $\sigma_4$ | |
| T | F | T | $\sigma_5$ | |
| T | T | F | $\sigma_6$ | |
| T | T | T | $\sigma_7$ | |

FIG. 4 illustrates the effect of the choice of symbol alphabets on the automata for the current example. Although the fusion algorithm is presented further, the emphasis here is more on the number of edges required than the actual fusion operator.

The symbolic approach is more efficient in terms of the number of edges required, and the number of states is unaffected. In general, when n Booleans are used in an assertion, a transition on a given Boolean actually requires $2^{n-1}$ edges, whereas only one edge is used in the symbolic alphabet. The symbolic alphabet developed in this work is actually based on a two-layer symbolic alphabet, using primary and extended symbols. Henceforth the expression symbolic alphabet will refer to the actual two-layer alphabet described below as part of the formal automaton definition.

Figure 5A:
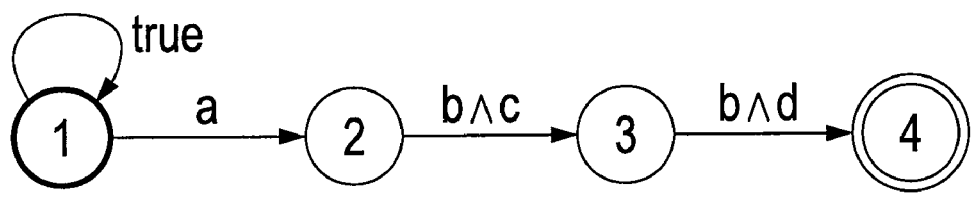
FIG. 5 represents an automata using: a) dual-level symbols, b) single-level symbols.
Figure 5B:
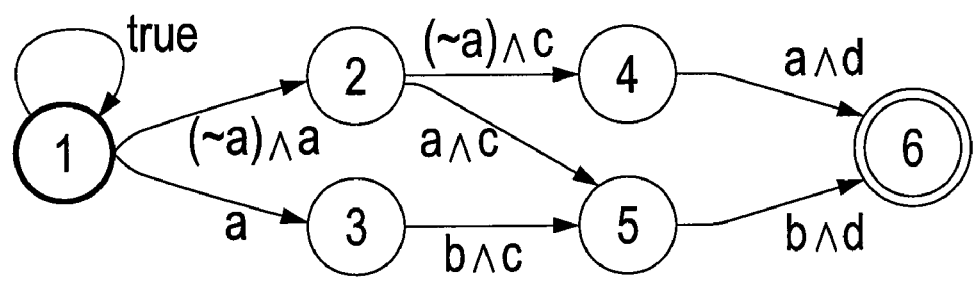

FIG. 5 also demonstrates an example of the efficiency of the dual-layer symbolic alphabet to reduce the number of edges. More precisely, FIG. 5 represents a circuit assertion that stipulates that two given subsequences must never simultaneously occur, starting and terminating at the same time. The second assertion was modified by a rewrite rule.

assert never {{a[->];b[*]} && {a;c;d}};
assert never {{{(~a)[*];a};b[*]} && {a;c;d}};

The rewritten assertion is expressed in automaton form as shown in FIG. 5 a), using dual-layer symbols. The never property has the effect of creating the true self-loop in state 1. The automaton has four states, compared to six states when single-layer symbols are used. With only one level of symbols, a new symbol must be created for (~a), and the automaton is not "aware" that (~a) and a are related, as can be seen in FIG. 5 b) in the edge from state 1 to state 2.

Automata Foundations

The Boolean Layer in PSL is built around the Boolean expressions of the underlying HDL, to which implication, equivalency; true, false and built-in functions are added. The symbol encoding used in the automata for assertions of the present invention is different than in classical pattern matching automata. In the present invention, the automata are denoted by A. The encoding of symbols is at the foundation of any automata formalism. The encoding utilized in the present invention differs from that which is used to represent conventional regular-expression matchers in automaton form because in assertions, arbitrary Boolean expressions are used instead of mutually exclusive symbols (as in characters for string matching, for example).

In the automaton formalism of the present invention, an automaton is represented by a sextuple $A = (Q, \Pi, \Sigma, \delta, I, F)$, where:

Q is a nonempty finite set of states;
$\Pi$ is a set of primary symbols that represent Booleans;
$\Sigma$ is a set of extended symbols defined from $\Pi$;
$\delta \subset Q \times \Sigma \times Q$ is a transition relation consisting of a subset of triples from $\{(s, \sigma, d) | s \in Q, \sigma \in \Sigma, d \in Q\}$;
$I \subset Q$ is a nonempty set of initial states;
$F \subset Q$ is a set of final (or accepting) states.

The term edge is used to refer to an element of the transition relation $\delta$, and is represented by an ordered triple $(s, \sigma, d)$, where an edge's extended symbol is denoted $\sigma$, and s and d are used to denote the source and destination states of an edge respectively. The transition relation is not complete, and there does not have to be a transition for each symbol in each state.

Each state also has a label, consisting of either an ordered pair, or a totally ordered set, depending on the application. Labels are an essential part of some of the algorithms appearing further. In the automaton definition for assertion checkers over Booleans, the language accepted by the automaton actually represents a set of traces. This set of traces violates the behavior given by the assertion, and it is the automaton's purpose to report such traces.

The notation $A(x)$ is used to denote the construction of an automaton from an argument expression x, where x can range from a simple Boolean to a full verification directive based on properties and sequences. The Booleans appearing in sequences and properties are used to form the primary symbols in the automaton's symbol alphabet, and primary symbols are then used to construct the actual extended symbols that appear on the edges in the automata.

A primary symbol $\pi$ represents the HDL code of a Boolean expression appearing in a sequence or property, with any outermost negation(s) removed. The set of primary symbols is denoted $\Pi$.

An extended symbol $\sigma$ is a single literal, or a conjunction of multiple literals, where a literal is a negated or non-negated primary symbol. A literal has a negative polarity if and only if its corresponding primary symbol has an odd number of outermost negations removed when entered as a primary symbol. The set of extended symbols is denoted $\Sigma$.

Boolean Primaries

A primary Boolean expression $\pi$ (or primary for short) is assigned to a positive top-level Boolean expression appearing in an assertion. A top-level Boolean expression is a Boolean expression for which no other more complex Boolean expression can be built-up from it in the place where it appears. If any top-level expressions are negative, they are made positive by removing any outer-most top-level negations; these negations are encoded in extended symbols, which are defined next. All of the Boolean primaries for an assertion are stored un-redundantly into a primary table.

Symbols Definition (Extended Symbols)

An extended symbol a defines a non-empty list of literals. A literal is a primary $\pi$, or a negated primary $-\pi$. In the symbol table, the list of literals, when there is more than one literal, represents the Boolean conjunction of these literals. All symbols are stored in a symbol table.

The extended symbols comprise the alphabet $\Sigma$ introduced previously. In other words, the symbol table is the data structure, which defines the values of the symbols from $\Sigma$. In the remainder of the text however, the actual symbol table will be referred-to using the $\Sigma$ symbol, and actual symbols are understood to be then indexed elements in the symbol table. It should be noted that the alphabet grows as processing advances, given that new symbols may appear during certain automata operations. The extended symbols defined above constitute precisely the symbols used on the edges in the automata of the present invention, and thus constitute the alphabet of the automaton.

The following example illustrates the primary and extended symbol tables. Given the assertion:

assert never {req & grant; !(ack !!grant)}, the primary table built from this assertion is:

$\pi_1$="req & grant"

$\pi_2$="(ack !!grant)"

and the extended symbol table built from this expression is:

$\sigma_1 = \pi_1$ $\sigma_2 = -\pi_2$

The symbol alphabet above is $\{\sigma_1, \sigma_2\}$. The symbols above require only single literals, however, subsequently to further processing in automaton form, other symbols may appear for which each can reference a list of literals.

Popular automata theory proposes a symbol encoding which represents the power set of the Boolean primitives, such that one and only one symbol is received at each step during the matching. However, when an assertion references many Boolean primitives, the exponential increase of the number of symbols and edges quickly becomes impractical. The approach of the present invention is to avoid the power set encoding and to develop the necessary automata-theory modifications that are required for the Boolean expression symbol encoding.

In the definition of automata of the present invention, the set of transitions δ is not complete, in the sense that a state does necessarily have outgoing edges for each symbol in Σ. In the present invention, the automata algorithms are made to operate on non-complete automata. When an automaton reaches a final state, an assertion failure has been caught. When represented graphically in this text and in FIGS. 6 to 9, the state in a bold circle is the start state of the automaton, and doubly circled states are final states.

The clock does not appear in the automaton definition, but is implicitly used to regulate the transition from one set of active states to another. This is analogous to conventional automata for string matching, where reading a character causes the automaton to transition.

Determinism vs. Non-Determinism

Since the symbols of the present invention represent Boolean expressions, the notion of determinism must be revised. For example, a state in which its outgoing edges have no redundant symbols may in fact transition into multiple next states (this is not the case with pattern matching symbols). Some automata algorithms of the present invention must thus take into account the fact that two symbols may simultaneously evaluate to true. The Boolean symbol encoding introduces a fundamental difference with normal regular expressions: in regular expressions, one symbol is received at each step, while Boolean expression based symbols allow multiple symbols to be activated at each step. The reason for this is that arbitrary Boolean primitives can simultaneously evaluate to true. With Boolean expression based symbols, the transition conditions represent complete Boolean-layer expressions. For a given assignment of various symbols, all conditions that are true will cause a transition into a new set of active states, thereby producing a non-deterministic automaton. A deterministic automaton is an automaton for which any given state may transition into at most one next state. This implies that, out of all the symbols on the outgoing edges of a given state, at most one must evaluate to "true" at any given evaluation time-point. The fact that no two outgoing edges from a given state have the same symbol is not a strong-enough condition for full determinism.

In the automaton foundations of the present invention, there can be two levels of determinization. A first level considers only the symbols (symbol identifiers, symbol numbers), and is referred-to as Weak Determinization. Weak Determinization can be accomplished with the usual Determinization algorithm found in typical automata textbooks. An example of such an algorithm is based on the classical subset construction technique, and appears in the WeakDeterminize( ) algorithm shown further. Incidentally, when considering the Boolean nature of the symbols, week-determinism is not necessarily deterministic. WeakDeterminize( ) is used in the Minimize( ) and Intersect( ) algorithms, shown further. The second level of determinism corresponds to that which was stated with respect to proper determinism: at most one Boolean condition may be true for the outgoing edges of any given state. To differentiate this true determinism from the Weak Determinism, it is referred-to as Strong Determinization. Strong Determinization is used in the FirstFail( ) and FirstMatch( ) algorithms, which, along with the StrongDeterminize( ) algorithm, are presented further.

Mixed Determinization

Because of possible side effect of the use of the minimization algorithm, the automata produced are always weakly deterministic. In some algorithms, weakly deterministic automata are used as input, and strongly deterministic automata are produced (FirstMatch( ) and FirstFail( )). When recursively combining sub-automata to form the entire assertion automata, some sub-automata are left weakly deterministic (and implicitly non-deterministic), while other portions have strongly deterministic behavior. Leaving a (sub)automaton weakly deterministic is advantageous because it avoids an exponential increase in the number of states typical to strong-determinization-like procedures, and hence more resource-efficient circuits are produced. The concept of mixing determinization levels in the same automaton introduced by the present invention will be hereinafter referred as mixed-determinization. This technique could also apply to traditional pattern matching automata, for which some parts would be deterministic and others non-deterministic.

It can be noted that because of the way the automata algorithms of the present invention are designed, the assertion result is not simply a yes/no answer given at the end of execution, but rather a continuous and dynamic report of when/where the assertion has failed, which is more useful for debugging purposes. Since the assertion checkers of the present invention may be generated as RTL code, they can be used both in simulation and in hardware emulation, as well as in post-fabrication silicon debugging.

Automata Minimization and Simplification

In PSL, the "true" and "false" expressions are also added as part of the Boolean layer. The true symbol is also used in SEREs as defined further. Because the true symbol always evaluates to Boolean true, simplifications can be performed when it is used in symbols in an automaton. The true and false primitives are detected as such in the primary table. When a symbol for true is required, a symbol is declared which contains one non-negated true primary. When the false symbol is encountered, a symbol is declared which contains one negated true primary. The primary table keeps track of which primary is the true primary, when it exists, in order to allow Boolean simplifications in the symbol table, and other simplifications.

The symbol tables are also used to perform Boolean simplifications for edges when a conjunction of symbols is required to create a new symbol. In general, the following simplifications are performed when managing symbols:

1) When the true primary appears in a symbol's list as a positive literal, it is removed, unless it is the only literal.
2) When the true primary appears in a symbol's list as a negative literal, the symbol is deleted and the edge that was being constructed is removed.
3) When a newly created symbol contains two literals of the same primary symbol, where one literal is of opposite polarity to the other, the symbol is deleted and the edge that was being constructed is removed.

Two edges $(s_1, \sigma_1, d_1)$ and $(s_2, \sigma_2, d_2)$ are called parallel if $s_1=s_2$ and $d_1=d_2$. Another form of simplification concerns parallel edges, which mainly appear in the automata resulting from the first-match and first-fail algorithms. When two parallel edges' symbols have the same list of literals, except for one literal which is based on the same primary, but whose polarities are reversed in each edge' symbols, a new symbol is created by removing the said literal, and the pair of edges is replaced by a single edge with this new symbol. This process continues until no more simplifications are possible.

The above simplifications affect the symbols on the edges of an automaton, and re-running the minimization algorithm can further optimize the automaton. The strategy employed in the present invention for minimizing automata is based on the Brzozowski automata minimization procedure, to which extra steps have been added to simplify the automaton when the start state has a self-loop with the true symbol, (see the Minimize( ) algorithm). Many assertion automata of the present invention will have this self-true loop on the start state in order to trigger the checking of the property during the entire run. For example: "assert never a;" will have a self-true loop on the start state to force the sub-automaton for a to be continually checked. When the start state has incoming edges, these edges can safely be removed because they do not need to trigger a state which is permanently activated. Removing edges, even if no state minimizations result, reduces processing effort when computing with the automaton in software, and/or reduces the amount of logic used to implement the automaton in hardware.

Another key factor in the minimization algorithm is the collapsing of final states in presence of self-loop edges with the true symbol (lines 4 and 9). The true edge differentiates itself from other edges because it is guaranteed to cause a transition at each cycle in the automaton. Incorporating knowledge of this fact in the minimization algorithm helps to implement another type of optimization, namely the collapsing of final states. The collapsing of final states in presence of the self-true loop is accomplished by the algorithm CollapseFinalStates( ), shown further. This algorithm removes a subset of final states that is closed under the true self loop. The algorithm works by detecting a true transition "(s, true, d)" between two final states, where state d has a true self-loop. The true self-loop can be safely replicated on the source state because it adds nothing to the language accepted by the automaton. Any outgoing edges from this source state can be safely removed because once a final state becomes active, the true self-loop will perpetually keep it active, and there is no point in triggering other states The main part of the minimization algorithm is based on Brzozowski's "reverse->determinize->reverse->determinize" algorithm (also called RDRD). The determinization used corresponds to the previously discussed Weak Determinization (as opposed to Strong Determinization). In order for the RDRD algorithm to operate properly, the reversal must be able to produce multiple initial states, and the determinization function, in turn, must be able to accept multiple start states. This mechanism is visible in the Reverse( ) algorithm.

In an embodiment of the present invention, numerous hash tables may be used to speed-up computations when dealing with the primary and symbol tables, as well as in the many subset-construction-based algorithms.

Automata Implementation of Assertions

The following paragraphs present the automata-based implementation of PSL expressions. The four main constituents of the PSL language, namely Booleans, sequences, properties and verification directives are each handled in separate paragraphs. Boolean, sequences and properties alone accomplish nothing for verification, and must be used in verification directives. The bottom-up construction therefore begins with PSL Booleans and ends with verification directives. The underlying expectation is to produce the smallest automata so that when converted to RTL circuits, the checkers utilize fewer hardware resources.

Booleans are implemented by first converting their expressions to HDL code, and then building a simple two-state automaton with the Boolean's symbol on the edge. Boolean automata are the building blocks for sequences, both of which are building blocks for properties. Sequences and properties are implemented using either direct algorithms or rewrite rules. Rewrite rules are a syntactic transformation and are used to avoid the need for explicitly implementing an operator. When no rewrite rules apply, operators are implemented with specific algorithms.

Implementation of Booleans

The building blocks of an assertion are Boolean expressions over the signals in the circuit under verification. Whether in sequences or properties, Booleans are the smallest and lowest constituents in the PSL language hierarchy. The present invention implements all the Booleans items as HDL code, and subsequently implements automata for Booleans.

In the following, H represents a portion of HDL code, and H(x) represents the conversion of an argument x into HDL code, and thus also represents a portion of HDL code. The argument can be a PSL expression or an automaton, depending on the case. The construction of an automaton from a never property is used below in the implementation of ended ( ). The default clock declaration is assumed to be a global clock string holding the name of the clock signal in effect.

To recall, the symbol A is used to represent an arbitrary automaton, and the functional form A(x) represents the construction of an automaton from an argument expression x, and is also an automaton because the return value is an automaton. A subscript, such as in $A_B(X)$, represents additional information to indicate what type of construction is desired (in this case Boolean). The other subscripts used are S, P and V for sequences, properties, and verification directives respectively.

Implementing the Boolean layer is done in two parts: first the conversion of a Boolean to HDL is presented, and afterwards the expression of an automaton for a Boolean, as used in a sequence or a property, is derived.

The conversion of Booleans to HDL is presented below in a manner such that the link between syntax and implementation can be better observed. In the following, non-italicized prefixes separated by an underscore represent an additional type constraint, and do not represent a new type as such.

If b is a Boolean, i is a nonnegative integer, e is an Expression, f is a built-in function and s is a Sequence then the HDL conversion of Booleans is denoted H(b), and is performed as follows:

H(b):
H(boolean_e)=[defined in next line]
H(e):
H(Verilog_e)=e
H($b_1$->$b_2$)=(~$b_1$|$b_2$)
H($b_1$<->$b_2$)=((~$b_1$|$b_2$) & (~$b_2$/$b_1$))
H(true)=1'b1
H(false)=1'b0
H(f)=[defined in next line]
H(f):
H(prev(e))=D$_{FF}$(e)
H(prev(e, i))=D$_{FF}^i$(e)
H(rose(bit_e))=(~D$_{FF}$(e) & e)
H(fell(bit_e))=(D$_{FF}$(e) & ~e)
H(onehot(bit_vector_e))=(((e−1) & e)==0)
H(onehot0(bit_vector_e))=(H(onehot(e)) // (e==0))
H(stable(e))=(D$_{FF}$(e)==e)
H(ended(s))=H(A$_P$(never s))

The items that have italicized comments in brackets do not actually need to be implemented and are only left to show the correspondence. Each item will be presented and explained below, immediately following its appearance.

Implication (->) and equivalence (<->) are not part of the Verilog language as such, and are added to the definition of Booleans. These operators are expressed in Verilog using their respective Boolean equivalencies, as shown on the right above.

In any given clock cycle n, the prev operator evaluates to the value of the argument expression at cycle n−i. The implementation for this operator is denoted symbolically above using the D$_{FF}^i$(e) function, and in reality corresponds to the instantiation of a register chain (or pipeline) with i stages in depth. The default clock is implicitly used as the clock signal for any flip-flop represented by the D$_{FF}$( ) notation; the input of the flip-flop is the argument and the return value of D$_{FF}$( ) represents the output of the flip-flop. Thus, the resulting expression of D$_{FF}^i$( ) evaluates to the signal or vector of the last register(s) in the chain. When the exponent is not specified, i=1 is assumed. The register pipeline has the same width as the argument expression e. This register chain is created as actual HDL code using Verilog non-blocking assignments and the clock signal that exists in the global clock string at that time. For the case i=0, no registers are created and the expression is returned directly.

The implementation of the onehot function takes advantage of the arithmetic operators that can be specified in languages such as Verilog. Detecting the cases where a single bit is active in a sequence of bits is performed with the "bit trick" involving decrementation and word-level intersection. The onehot0 function also allows for all-zeros to occur, and is implemented using onehot( ) with an additional Boolean expression.

The ended( ) function evaluates to logic-1 every time the argument sequence is matched.

This is modeled using the never property, which triggers whenever its sequence argument is detected.

The previous items show how any PSL Boolean can be expressed at the HDL level. Constructing an automaton for the matching of a Boolean, as required in sequences and properties, is described next If b is a Boolean and H(b) represents the HDL expression for b, then the construction of an automaton for Boolean b, denoted A$_B$(b), is performed as follows:
A$_B$(b):
A$_B$(b)=B$_{ASE}$C$_{ASE}$(H(b))

An implicit consequence of the separate implementations is that automata are built only for top-level Booleans as opposed to building automata for arbitrary sub-expressions of a complex Boolean expression.

Figure 10:
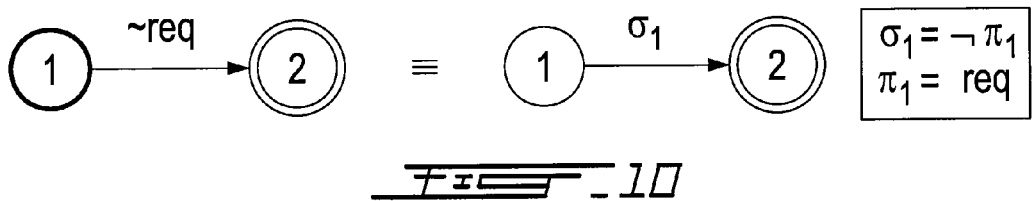
FIG. 10 depicts an automaton for Boolean ~req, denoted $A_B$(~req), using a simplified representation (left) and detailed representation (right)

The algorithm for creating an automaton for a Boolean's HDL expression, called BaseCase( ), is described further. This is the base case for the inductive automaton construction procedure for sequences. The algorithm takes an HDL expression as argument, and proceeds to build an extended symbol to represent it. Top-level negations are removed in line 2 and added in line 5 when necessary. The primary symbol table is used in line 3, whereas the extended symbol table is used in lines 5 and 7. This is where the dual-layer symbol alphabet takes form. The automaton that is returned in line 8 has two states, the first is an initial state and the second is a final state. A single edge connects the two in the proper direction. An example is shown in FIG. 10 for the Boolean ~req, where req is a valid signal in the design to be verified. The simplified representation on the left in the figure is used for convenience; however, the detailed representation shows how the symbol tables are actually used.

Implementation of Sequences

Sequences, or Sequential-Extended Regular Expressions (SEREs), are used to specify temporal chains of events of Boolean expressions. Henceforth, both A$_S$(s) indicates the construction of an automaton for a given PSL sequence s.

Figure 6:
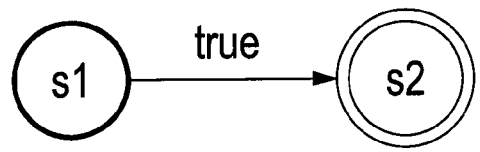
FIG. 6 shows an example of an automaton for $A_B$(true), $A_P$(false)
Figure 7:
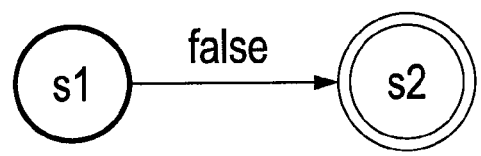
FIG. 7 shows an example of an automaton for $A_B$(false), $A_P$(true)

FIGS. 6 and 7 show simple automata for the Boolean expressions true and false, in both modes. In FIG. 7, since the false symbol can never be true, the automaton never reaches the final state.

Figure 8:
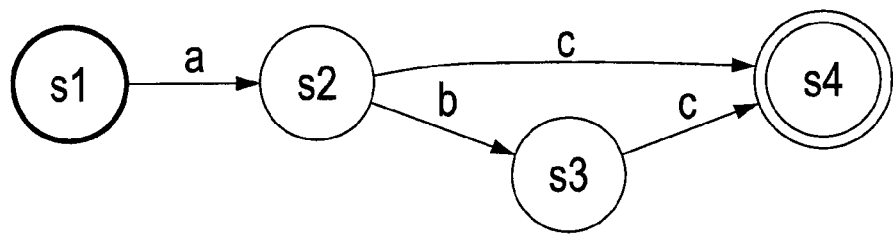
FIG. 8 shows an example of an automaton for $A_S(\{a;b[*0:1];c\})$.
Figure 9:
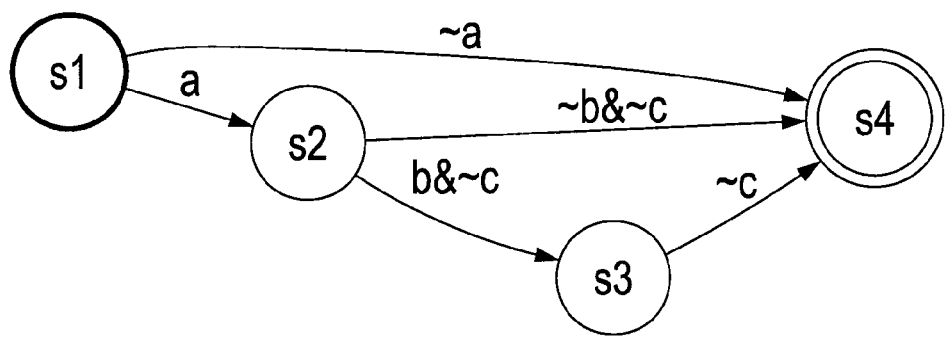
FIG. 9 shows an example of an automaton for $A_P(\{a;b[*0:1];c\})$.

FIG. 8 shows an automaton for detecting the sequence {a;b[*0:1];c}. FIG. 9 shows how the same sequence is processed by an automaton, when the sequence is used directly as a property. The state in a bold circle is the start state of the automaton.

A sequence is converted to an equivalent automaton in an inductive manner. First, terminal automata are built for the Booleans in a sequence. Next, these automata are recursively combined according to the sequence operators comprising the given expression.

Sequences are an important part of the temporal layer in PSL, and are implemented using either rewrite rules or separate algorithms. Although no distinction will be made here as to what operators are sugaring rules and which are base cases, some of the rewrite rules are based on the sugaring definitions of the PSL specification.

Other sequence operators are implemented with specialized algorithms, such as fusion and intersection. These two operators are not often used in automata for conventional regular expressions, and the related algorithms will each be treated subsequently. An important factor that must be considered in these and other automata algorithms is the symbolic alphabet used to perform pattern matching over Boolean expressions.

The automaton implementation of sequences is shown below. Items with an italicized comment in square brackets are part of the BNF syntax specification and were maintained to keep as similar as possible to its related definition.

If i and j represent nonnegative integers with j≧i, and k and l represent positive integers with l≧k, b represents a Boolean, s represents a Sequence, r represents a SERE, r_r represents a repeated_SERE, c_r represents a compound_SERE, then the automaton implementation of sequences, denoted A$_S$(s), is performed as follows:
A$_S$(s):
  A$_S$(r_r)=[defined below]
  A$_S$({r})=A$_S$(r)
A$_S$(r):
  A$_S$(b)=A$_B$(b)

As(s)=[defined above]
As(r$_1$; r$_2$)=CONCATENATE(As(r$_1$), As(r$_2$))
As(r$_1$: r$_2$)=FUSE(As(r$_1$), As(r$_2$))
As(c_r) =[defined in next line]
As(c_r):
  As(s)=[defined above]
  As(c_r$_1$| c_r$_2$)=CHOICE(As(c_r$_1$), A$_S$(c_r$_2$))
  As(c_r$_1$& c_r$_2$)=As({{c_r$_1$}&&{c_r$_2$ [*]}} | {{c_r$_1$;[*]}&&{c_r$_2$}})
  As(c_r$_1$&& c_r$_2$)=INTERSECT(As(c_r$_1$), As(c_r$_2$))
  As(c_r$_1$ within c_r$_2$)=As({[*];c_r$_1$;[*]} && {c_r$_2$})
As(r_r):
  As(b[*])=KLEENECLOSURE(AB(b))
  As(b[*i])=As(b[*i:i])
  As(b[*i:j])=RANGEREPEAT(i, j, AB(b))
  As(b[*i:inf])=As(b[*i];b[*])
  As(s[*]) KLEENECLOSURE(As(s))
  As(s[*i])=As(s[*i:i])
  As(s[*i:j])=RANGEREPEAT(i, j, As(s))
  As(s[*i:inf])=As(s[*i];s[*])
  As([*])=As(true[*])
  As([*i])=As(true[*i])
  As([*i:j])=As(true[*i:j])
  As([*i:inf])=As(true[*i:inf])
  As(b[+])=As(b;b[*])
  As(s[+])=As(s;s[*])
  As([+])=As(true; true[*])
  As(b[=i])=As(b[=i:i])
  As(b[=i:j])=As({~b[*];b}[*i:j]; ~b[*])
  As(b[=i:inf])=As(b[=i]; [*])
  As(b[->])=As(b[->1])
  As(b[->k])=As(b[->k:k])
  As(b[->k:l])=As({~b[*]; b}[*k:l])
  As(b[->k:inf])=As({b[->k]}; {[*0]}|{[*];b})

The item As(b)=AB(b) uses the automata construction for Booleans previously defined. All other items fall into two categories, namely those with direct algorithm implementations, and those that are implemented using rewrite rules. Those with rewrite rules can be easily identified since they have the form As(x)=As(y).

The following algorithms build automata for, and are utilized in properties as required. A sequence can be converted to an equivalent finite automaton in a recursive manner. First, terminal automata are built for the Boolean expressions. Next, these automata are recursively combined according to the operators used in a sequence.

The conventional operators for regular expressions are concatenation, choice and the Kleene star. These operators are implemented in automata using custom algorithms which have the same effect as utilizing the typical McNaughton-Yamada construction procedure for NFAs with epsilon transitions and then performing the typical epsilon removal procedure. Our epsilon-less algorithms for concatenation, choice and Kleene star are shown further, in the Concatenate( ), Choice( ) and KleeneClosure( ) algorithms respectively. Epsilon transitions are not used in the automata of this embodiment of the present invention, and thus do not need to be handled when converting the automaton to hardware.

The typical automata intersection operation, which equates to building a product automaton of both arguments, is incompatible with the Boolean expression symbol encoding. If the traditional intersection procedure for regular expressions is applied to two automata which have no symbol in common, an empty (and thus incorrect) automaton results. To implement intersection for sequence-automata, the condition on syntactic equality of symbols must be relaxed and the conjunction of symbols must be considered by the algorithm. To consider all relevant pairs of edges, the intersection automaton is preferably built using the subset construction technique. This technique, characterized by its creation stack, is visible in the intersection algorithm Intersect( ), presented further.

Sequence fusion can be seen as an overlapped concatenation. The algorithm for performing the fusion of two sequence-automata is shown in the Fuse( ) algorithm.

The RangeRepeat( ) algorithm performs a repeated concatenation of an argument sequence. The algorithm also manages start states properly in order to correctly match a range i:j of instances of a sequence.

The items in the implementation of sequences listed previously in the text that have not been treated thus far with a particular algorithm have a common characteristic: they have the form As(x)=As(y). More generally, the link between the arguments can be expressed as a rewrite rule of the form x→y, where x is rewritten to y. Expression rewriting (or term rewriting) is a practical way of allowing the checker generator to handle the large amount of sequence operators, while actually only implementing algorithms for a much smaller number of operators in the tool's kernel. The rewrite rules used are either derived from the SERE sugaring definitions in the PSL manuals directly, or with small modifications. Although a few rewrite rules may appear intuitive, they were nonetheless included for completeness.

Implementation of Properties

PSL also defines properties on sequences and Boolean expressions. When used in properties, SEREs are placed in curly brackets. Sequences are denoted using the symbol s, which are formed from SEREs:

s:={r}

SEREs and sequences are different entities, and production rules are more constrained than what was previously stated in the definition of SEREs. For example, the && operator requires arguments in curly brackets. Since the present invention is mainly concerned with the effect of an operator, the exact syntax rules are deferred to the PSL language manual.

Properties, like SEREs, are built from a reasonably compact set of operators, to which "sugaring" operators are also added. However, because the simple subset imposes many modifications to the arguments of properties, we will not make the distinction between sugaring and base operators.

Some forms of properties are not suitable for simulation/emulation and can only be evaluated by formal methods. The portion of PSL suitable for simulation is referred to as the simple subset of PSL. The PSL foundation language properties are shown below (in the Verilog flavor). The properties have been slightly modified to reflect the recent IEEE standard for PSL, and are presented with the simple subset modifications (Section 4.4.4 in the IEEE 1850 standard specification). Since entire properties are clocked to the same signal edge in the checkers of the present invention, the clocking property is not shown. Furthermore, PSL's LTL operators X, G, F, U and W are syntactically equivalent to next, always, eventually!, until! and until, respectively, and are omitted.

If i and j represent nonnegative integers with j≧i, k and l represent positive integers with l≧k, b is a Boolean, s is a Sequence, f_p is a FL_Property, p is a property, then the automaton implementation of properties, denoted AP(p), is performed as follows:

AP(p):
  AP (forall ident in boolean: p)=CHOICE(AP((p)ident←true), AP((p)ident←false))
  AP (forall ident in {i:j}: p) =FORALLRANGE(i, j, ident, p)
  AP (f_p)=[defined in next line]
AP (f_p):

$A_P(b) = \text{FirstFail}(A_B(b))$
$A_P((f\_p)) = A_P(f\_p)$
$A_P(s\,!) = \text{FirstFailStrong}(A_S(s))$
$A_P(s) = \text{FirstFail}(A_S(s))$
$A_P(f\_p \text{ abort } b) = \text{AddLiteral}(A_P(f\_p), H(\sim b))$
$A_P(!\, b) = \text{FirstFail}(A_B(\sim b))$
$A_P(f\_p_1 \,\&\&\, f\_p_2) = \text{Choice}(A_P(f\_p1), A_P(f\_p_2))$
$A_P(b \,\|f\_p) = A_P(\{\sim b\}|\text{->}f\_p)$
$A_P(b\text{->}f\_p) = A_P(\{b\}|\text{->}f\_p)$
$A_P(b_1 <\text{->} b_2) = \text{FirstFail}(A_B(b_1 <\text{->} b_2))$
$A_P(\text{always } f\_p) = A_P(\{[+]\}\,|\text{->}f\_p)$
$A_P(\text{never } s) = A_P(\{[+]:s\}\,|\text{->false})$
$A_P(\text{next } f\_p) = A_P(\text{next}[1](f\_p))$
$A_P(\text{next! } f\_p) = A_P(\text{next!}[1](f\_p))$
$A_P(\text{eventually! } s) = A_P(\{[+]:s\}!)$
$A_P(f\_p \text{ until! } b) = A_P((f\_p \text{ until } b) \,\&\&\, (\{b[\text{->}]\}!))$
$A_P(f\_p \text{ until } b) = A_P(\{(\sim b)[+]\}|\text{->}f\_p)$
$A_P(f\_p \text{ until!\_b}) = A_P((f\_p \text{ until\_b}) \,\&\&\, (\{b[\text{->}]\}!))$
$A_P(f\_p \text{ until\_b}) = A_P(\{\{(\sim b)[+]\}|\{b[\text{->}]\}\}|\text{->}f\_p)$
$A_P(b_1 \text{before!} b_2) = A_P(\{\{(\sim b_1 \&\sim b_2)[*]\}(b_1 \& \sim b_2)\}!)$
$A_P(b_1 \text{before } b_2) = A_P(\{\{(\sim b_1 \&\sim b_2)[*]\}(b_1 \& \sim b_2)\})$
$A_P(b_1 \text{before!\_}b_2) = A_P(\{(\sim b_1 \&\sim b_2)[*]\}b_1\}!)$
$A_P(b_1 \text{before\_}b_2) = A_P(\{(\sim b_1 \&\sim b_2)[*]\}b_1\})$
$A_P(\text{next}[i](f\_p)) = A_P(\text{next\_event}(\text{true})[i+1](f\_p))$
$A_P(\text{next!}[i](f\_p)) = A_P(\text{next\_event!}(\text{true})[i+1](f\_p))$
$A_P(\text{next\_a}[i:j](f\_p)) = A_P(\text{next\_event\_a}(\text{true})[i+1:\ j+1](f\_p))$
$A_P\ (\text{next\_a!}[i:j](f\_p)) = A_P(\text{next\_event\_a!}(\text{true})[i+1:\ j+1](f\_p))$
$A_P(\text{next\_e}[i:j](b)) = A_P(\text{next\_event\_e}(\text{true})[i+1:j+1](b))$
$A_P(\text{next\_e!}[i:j](b)) = A_P(\text{next\_event\_e!}(\text{true})[i+1:j+1](b))$
$A_P(\text{next\_event!}(b)(f\_p)) = A_P(\text{next\_event!}(b)[1](f\_p))$
$A_P(\text{next\_event}(b)(f\_p)) = A_P(\text{next\_event}(b)[1](f\_p))$
$A_P(\text{next\_event!}(b)[k](f\_p)) = A_P(\text{next\_event\_a!}(b)[k:k](f\_p))$
$A_P(\text{next\_event}(b)[k](f\_)) = A_P(\text{next\_event\_a}(b)[k:k](f\_p))$
$A_P(\text{next\_event\_a!}(b)[k:l](f\_p)) = A_P(\text{next\_event\_a}(b)[k:l](f\_p) \,\&\&\, \{b[\text{->}l]\}!)$
$A_P(\text{next\_event\_a}(b)[k:l](f\_p)) = A_P(\{b[\text{->}k:l]\}|\text{->}f\_p)$
$A_P(\text{next\_event\_e!}(b_1)[k:l](b_2)) = A_P(\{b_1[\text{->}k:l]:b_2\}!)$
$A_P(\text{next\_event\_e}(b_1)[k:l](b_2)) = A_P(\{b_1[\text{->}k:l]b_2\})$
$A_P(s\,|\text{->}f\_p) = F_{USE}(A_S(s), A_P(f\_p))$
$A_P(s\,|\text{=>}f\_p) = A_P(\{s;\text{true}\}|\text{->}f\_p)$ The items in the form $A_P(x) = A_P(y)$ actually denote rewrite rules in the form $x \rightarrow y$. The last rewrite rule listed above (for the |=> operator) follows directly from the PSL specification.

The Choice( ) and Fuse( ) algorithms are the same ones that were devised for sequences, mentioned previously.

The ForallRange( ) algorithm is used to implement the forall operator for an integer range, and is shown further( ).

The FirstFail( ) and FirstFailStrong( ) algorithms implement failure matching automata from regular occurrence matching automata, and are shown further( ). The strong version is used to implement temporally strong sequences.

The AddLiteral( ) algorithm is used to implement the abort operator, and is shown further.

Implementing Verification Directives

If s is a Sequence, p is a property and v is a verification directive, then the automaton implementation of verification directives, denoted Av(v), is performed as follows:

Av(v):

Av(assert p;)=$A_P$(p)
Av(cover s;)=Av(assert eventually!s;)

The assert directive is implemented by directly returning the automaton created for its argument property. The property identifies all faulty traces, and nothing more needs to be done for implementing the assert directive.

The cover directive provides a way to ensure that a given sequence has eventually manifested itself during the verification. In this invention we thus rewrite the directive using the eventually! property Enhancing Assertion Checkers for Debug In this section, multiple debugging enhancements that can be compiled into the assertion checker circuits produced by the checker generator of the present invention are presented. These enhancements increase the observability of signals in assertion circuits, and increase the amount of coverage information provided by the checkers. Facilitation the debugging experience with assertion checkers can greatly help reduce the debug cycle and improve time to market. By providing extra debug features, the checkers obtained by the present invention offer more than an identification of a functional error, they help the user visualize the cause of an assertion failure, and subsequently to converge more quickly on the exact cause. The gathering of additional coverage metrics from assertions can also help verification by helping to assess the effectiveness of a test bench.

The checker generator of the present invention produces assertion-monitoring circuits from PSL statements and augments these checkers with debug-assist circuitry. Other forms of debug information, such as signal dependencies, can also be sent to the front-end applications. Since major FPGA manufacturers now provide hardware interface tools such as embedded logic analyzers, this allows the integration of the teachings of the present invention even in the simplest, low-end emulation platforms. The present approach is built on providing software control during the checker generation process, which lets the tool instrument, the checkers with enhancements that help converge to the root cause of an assertion failure.

Reporting Signal Dependencies

When debugging failed assertions, it is useful to quickly determine which signals and parameters can influence the assertion output. In the generated checkers' HDL code, all of the signal and parameter dependencies are listed in comments before each assertion circuit. When an assertion fails, the signals that are referenced in an assertion can be automatically added to a wave window and/or extracted from an emulator, in order to provide the necessary visibility for debugging. Dependencies are particularly helpful when complex assertions fail, especially when an assertion references other user-declared sequences and/or properties, as allowed in PSL. In such cases, assertion signal dependencies help to narrow down the causes of an error. Signal dependencies can also help to determine which signals must be stimulated in order to properly exercise an assertion that is found to be trivially true.

Monitoring Activity

The Booleans and sequences appearing in assertions can be monitored for activity to provide added feedback on the matching process. Monitoring the activity of a sequence is a quick way of knowing whether the input stimulus is actually exercising a portion of an assertion. The monitoring is performed on the states of the automata that represent the sequences and Booleans. Activity is defined as a disjunction of all states in an automaton. Anytime a state is active, the automaton is considered to be active. A sequence's automaton can exhibit internal activity when undergoing a matching, even if its output does not trigger. Conversely, if a sequence output triggers, the automaton representing it is guaranteed to show internal activity.

Using the appropriate compilation option, the tool of the present invention declares activity signals for each sequence sub-circuit. The only states that are excluded from consideration for activity monitors are: initial states that have a true self-loop, and the final state when a sequence is the antecedent of the |=> operator. The reason for these exceptions is that any initial state with a true self-loop does not represent meaningful activity. Furthermore, when a sequence appears as the antecedent of a non-overlapped suffix implication, it is rewritten to an overlapped implication by concatenating an extra {true} sequence element to the end of the sequence. This added sequence element creates a single final state in the antecedent, which also does not represent meaningful activity.

Figure 11:
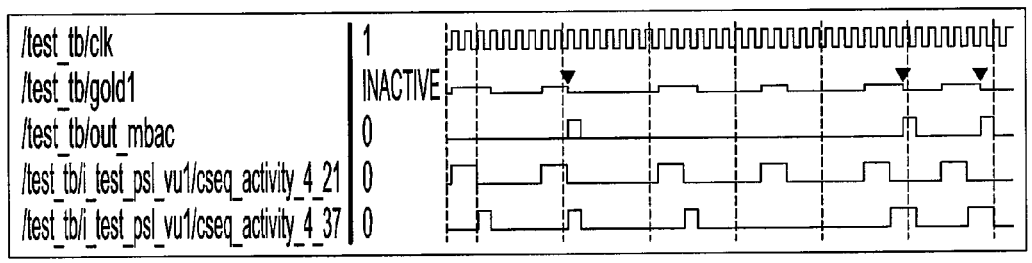
FIG. 11 shows a signal chart of activity signals for property: always ({a;b}|=>{c[*0:1];d}) where oseq corresponds to the right-side sequence, and cseq to the left-side sequence.

An example of activity signals is visible in FIG. 11 for the following assertion:

assert always ({a;b}|=>{c[*0:1];d});

Here, the activity signals for both sequences are visible, along with the assertion signal (out_mbac), and the assertion as interpreted by the Modelsim™ simulator (gold1). As can be observed, the union of both activity signals coincides with Modelsim™'s activity indication. Since the present invention's assertion signal is registered, it is asserted on the clock cycle following Modelsim™'s failure marker (downward triangle).

Monitoring activity signals eases debugging by improving visibility in assertion-circuit processing. An implication in which the antecedent is never matched is said to pass vacuously. When monitoring antecedent activity, a permanently inactive antecedent does indeed indicate vacuity; however, this seldom occurs given that a single Boolean condition is enough to activate a state within the antecedent's automaton. In order for activity monitors to be the most effective for vacuity detection, the consequent needs to instead be monitored because an inactive consequent means that the antecedent was never fully detected, and thus never triggered the consequent. If no activity was ever detected in the consequent of a temporal implication, this indicates that the implication is vacuously true. The fact that the antecedent never fully occurred does not mean that there was no activity within it; conversely, activity in the antecedent does not mean that it fully occurred.

Monitoring activity for Boolean terminals can also be performed, as required in the property "a->next b", for example.

Under normal conditions, each assertion is represented by a single automaton before its transformation to RTL. To implement activity monitors, it is necessary to isolate the automaton of a sequence so that it is not merged with the remainder of the assertion's automaton during minimization. The automata that are isolated correspond to the subexpressions that are being monitored, which in turn correspond to top-level sequences or Boolean expressions appearing in properties. Thus, mechanism number 2 is employed when this enhancement is turned on by the user (using command-line switches). This is required so that a child can transform its automaton in a module from which an activity signal is built, and that module can be triggered properly, and also so that it can retain its structural integrity.

Monitoring Assertion Completion

In order to gauge the effectiveness of a test bench, assertions must be exercised reasonably often in order to be meaningful. After-all, assertions that do not trigger because they were not exercised are not very useful for verification. Conversely, assertions that are extensively exercised but never trigger offer more assurance that the design is operating properly.

Figure 12:
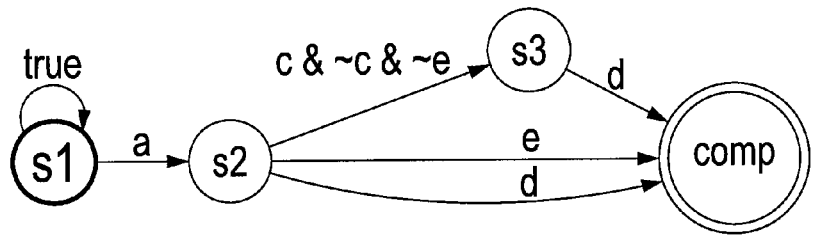
FIG. 12 shows a debug automaton for: always ({a}|=>{{c[*0:1];d}|{e}}) where a final state indicates when the property completes.
Figure 13:
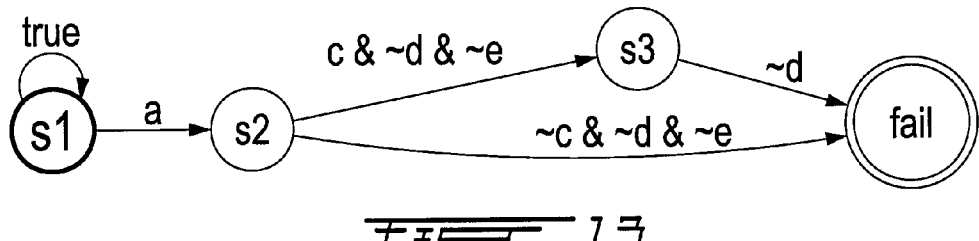
FIG. 13 shows an automaton for: always ({a}|=>{{c[*0:1];d}|{e}}), where the final state indicates when the property fails.

Assertions can alternatively be compiled in completion mode, whereby the result signal indicates when the assertion completed successfully. The algorithm for converting a detection automaton into a first-match automaton suitable for implementing completion mode is called FirstMatch( ). This algorithm is used when a Boolean expression or a sequence appears directly at the property level. The completion mode has no effect on assertions of the type "assert never {seq}", given that no obligations are placed on any Boolean expressions; that is, seq appears in pattern matching mode As( ). Compiling an assertion in completion mode is very similar to normal compilation, the only difference being that the First-Match( ) algorithm is invoked at every place where the First-Fail( ) and FirstFailStrong( ) is called. The FirstMatch( ) algorithm can also be used to implement the "first-match" operator in SystemVerilog™ Assertions. Assertion completion can be visualized using an example.

assert always ({a}|=>{{c[*0:1];d}|{e}});

In completion mode, the consequent automaton (right side of |=>) is modified to detect the completion of the sequence. For a given start condition, only the first completion is identified by the automaton. An example of completion monitoring is shown in FIG. 12. As a reference point, the example assertion is normally compiled as the automaton shown in FIG. 13. In this case, the result signal (or final state) is triggered when the assertion fails. The highlighted state s1 indicates the initial state, which is the only active state upon reset. The PSL abort operator has the effect of resetting a portion of the checker circuitry, and thus applies equally to normal mode or completion mode.

Counting Assertions and Coverage

The present invention further includes options to automatically create counters on assert and cover directives for counting activity. Counting assertion failures is straightforward; however counting the cover directive requires particular modifications. In dynamic verification, the cover operator is rewritten as follows:

cover seq ⇒assert eventually! seq

This approach is not compatible with counters (and in general is not useful for debugging) because eventually! is a liveness property, and in dynamic verification can only trigger at the end of execution. In order to count occurrences for coverage metrics, a plain detection (or matching) automaton is instead built for the sequence, and a counter is used to count the number of times the sequence occurs. The cover signal then triggers only at the end-of-execution if the counter is at zero. If no counters are desired, a one-bit counter is implicitly used. The counters are built to saturate at their final count and do not roll-over. The counters are also initialized by a reset of the assertion checker circuit, typically the reset of the Device Under Verification (DUV).

Counters can be used with completion mode to construct more detailed coverage metrics for a given test bench. Knowing how many times an assertion completed successfully can be just as useful as knowing how many times an assertion failed. For example, if a predetermined number of a certain type of bus transaction is initiated by a test bench, and an assertion that is responsible for catching a faulty sequence never fails, we may deduce that this particular transaction type is working properly. For added sanity checking, the assertion could be compiled in completion mode with a counter, and at the end of the test bench, this count value should correspond to the number of bus transactions that were exercised. In the example, the assertion may have passed because a different kind of transfer was erroneously issued. Completion mode provides a confirmation that if an assertion never failed, it was not because of a lack of stimulus. Counters and completion of assertions are implemented in simulators such as Modelsim™; it is therefore natural that these features be also incorporated into assertion circuits.

Hardware Assertion Threading

Assertion threading is a technique by which multiple copies of a sequence checking circuit are instantiated. Each copy (or thread) is alternately activated one after the other, as the sequence receives activations. This allows a violation's condition to be separated from the other concurrent activity in the assertion circuit, in order to help visualize the exact start condition that caused a failure. In general, using a single automaton mixes all the temporal checks in the automaton during processing. The advantage with this is that a single automaton can catch all failures; however the disadvantage is that it becomes more difficult to correlate a given failure with its input conditions. The assertion threading in effect separates the concurrent activity to help identify the cause of events leading to an assertion failure. Threading applies to PSL sequences, which are the typical means for specifying complex temporal chains of events. By extension, threading applies to any PSL property in which one or more sequences appear. The threading of Booleans used as properties is not performed given the temporal simplicity of Booleans.

For threading of very long sequences, or even unbounded sequences that use the [*] operator (Kleene star), a larger but finite number of threads can be instantiated. When the number of threads is smaller than the maximum length of the sequence, it may not always be possible to completely separate the activity into different threads. If a thread is undertaking a matching and it receives another activation, identifying the precise cause of a failure becomes more difficult. When the resources allow it, increasing the number of hardware threads can help to properly isolate a sequence. In all cases, it is important to state that no matches can ever be missed, as a single automaton can concurrently handle all activations.

An example scenario where assertion threading is useful is in the verification of highly pipelined circuits, where temporally complex sequences are used in assertions. In such cases, it is highly desirable to partition sequences into different threads in order to separate a failure sequence from other sequences. Assertion threading achieves the effect of creating multiple deterministic state machines, which are more natural to hardware designers and intuitive for debugging.

Figure 14:
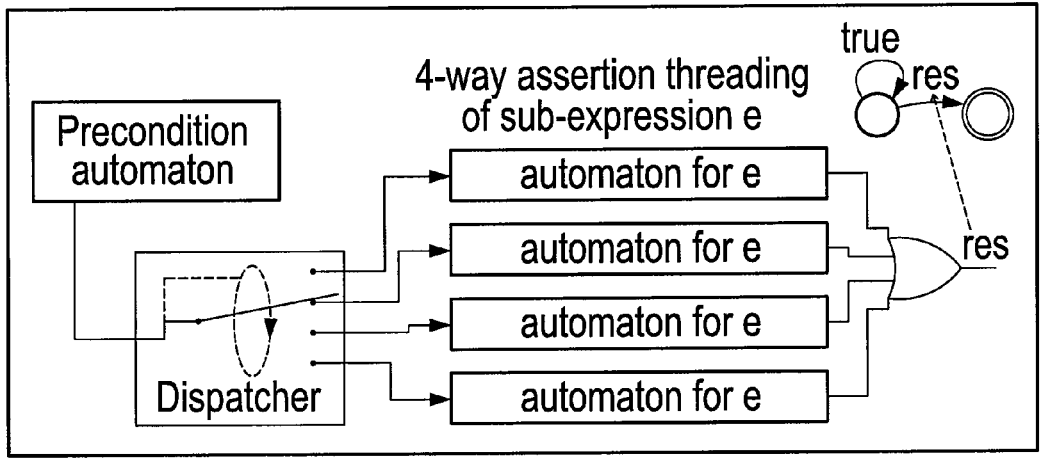
FIG. 14 illustrates hardware assertion threading.

FIG. 14 illustrates the mechanisms used to implement assertion threading. The hardware dispatcher redirects the precondition signal (also called activation) to the multiple sequence-checker units one after the other (round-robin). When a thread reports a matching (occurrence or failure), the current state of the hardware dispatcher can be used to correlate the failure with the appropriate start condition that caused the failure. This is important for helping to debug multiple concurrent and overlapping errors, as in pipelined circuits for example.

In assertion threading, entire failure-detection sequence-automata are replicated. Since a single automaton will detect all sequence failures, replicating the automaton and sending activations into different copies ensures that no failure will be missed. The dispatcher successively sends an activation into the next automaton thread such that it is guaranteed to be passed to one of the hardware threads. If an activation enters a thread for which a previous activation is still being processed, identifying the precise cause of a failure becomes more difficult; however, no failures will be missed. In such cases, all that must be done is to increase the number of hardware threads in order to properly isolate a sequence. To complete the threading, the sequence output is a disjunction of the threaded automata outputs. Threading also applies to sequences in the left side of a temporal implication. In such cases, normal detection sequence automata (as opposed to failure detection) are replicated. Seen from the sub-circuit boundary, a multi-threaded sub-circuit's behavior is identical to that of a non-threaded sub-circuit. Assertion threading does not apply to single Boolean expressions given their lack of temporal complexity.

Mechanism number 2 is employed when this enhancement is turned on by the user (using command-line switches). This is required so that a child can transform its automaton in a module where it can be replicated the number of times required for threading, and also so that each thread can be triggered properly by the dispatcher. The child node must instantiate the circuit for the precondition automaton, whose result signal is used in the dispatcher circuit.

More Efficient form for Implementing "Eventually!" Operator

Figure 18:
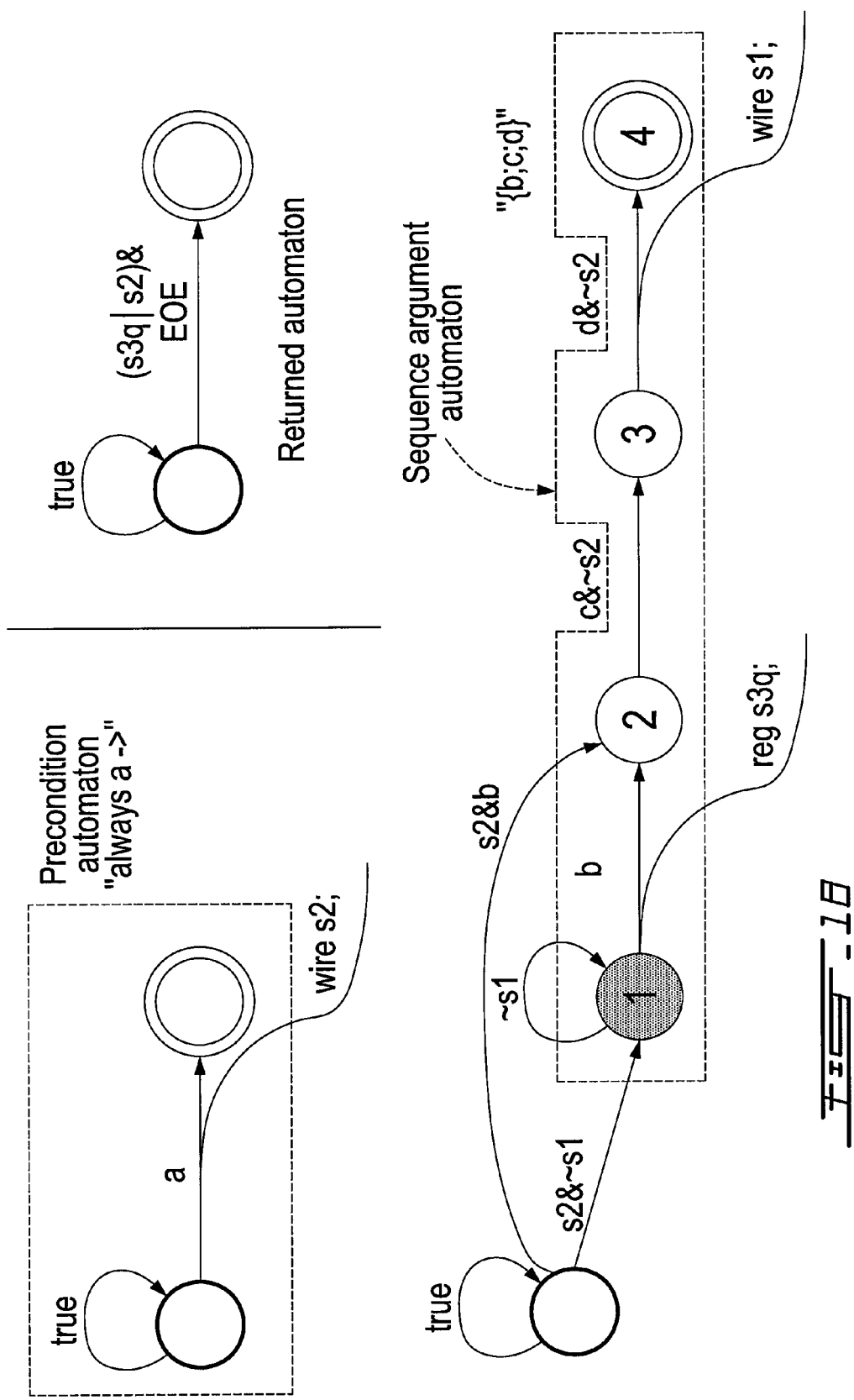
FIG. 18 depicts an example of an efficient eventually operator.
Figure 19:
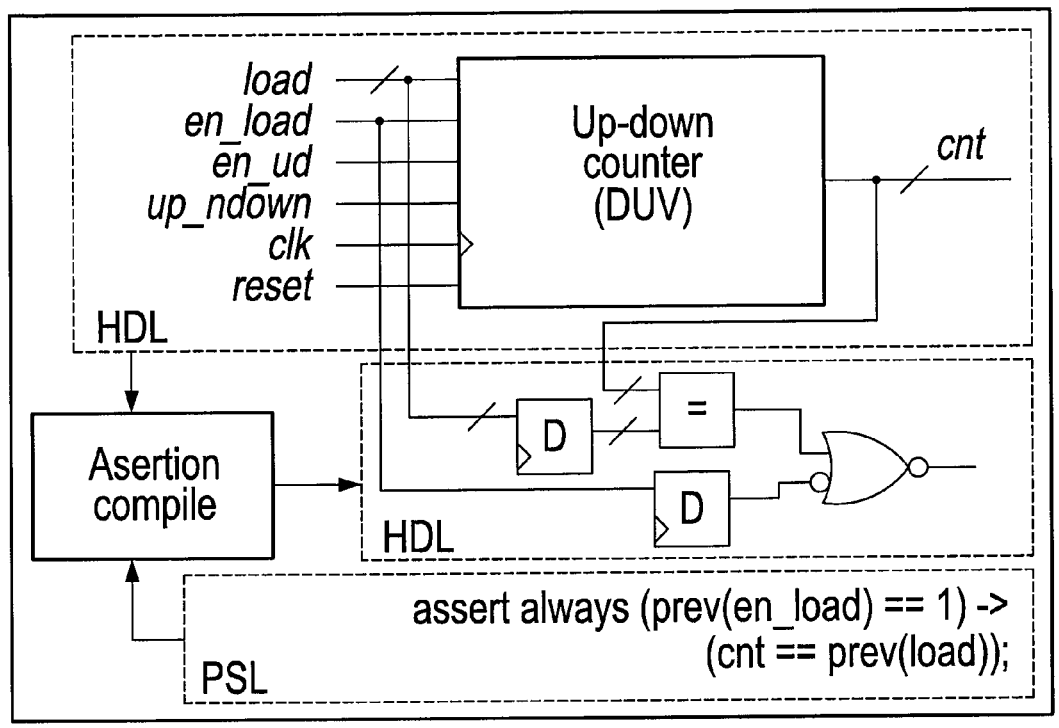
FIG. 19 depicts the global approach to using a checker generator (assertion compiler in the figure) to create circuit checkers from high-level assertion; the figure exemplifies this with a simple assertion for an up-down counter.

Reference is now made to FIG. 18, which depicts an exemplary rewrite of the eventually! operator. The rewrite rule for eventually! that was previously described has the advantage of preserving the full automaton approach, however, given its usage of failure-matching sequence in the right hand side of the rewrite rule, it is not the most efficient form. This part details the use of an alternate procedure for implementing the eventually! property, which can be used when maximal circuit-efficiency is required, and breaking the automaton into multiple automata is allowed, and the use of separate custom logic and flip-flops is permitted. This is also important for an efficient implementation of the cover statement when it is rewritten to use the eventually! operator, as shown previously.

$A_P$ (eventually! s)→$A_P$({[+]: s}!) if s is non-degenerate, $A_P$(never {EOE}) otherwise This strategy has the advantage of preserving the full automaton approach; however, given that the sequence in the right-hand side of the non-degenerate case is used as a property, the FIRSTFAILSTRONG( ) algorithm has to be applied to the sequence. That algorithm requires a proper determinization, and thus does not represent the most efficient solution. This section details the use of a more efficient procedure for implementing the eventually! property, in cases where automata splitting is allowed and the use of separate logic and wire declarations are permitted. An efficient implementation of eventually! is also important for the cover directive which is rewritten to the eventually! operator in dynamic verification. Although automata optimizations can no longer cross the boundaries of split automata, the improvements brought upon by the split approach outweigh this disadvantage.

In the split automata approach, implementing the "eventually! s" property is done with a normal occurrence-matching automaton. After the automaton for the sequence s is built, its initial states are made non-final. At this point, if the sequence automaton has no final states, the sequence can not eventually occur, and the failure must be signaled at the end of execution. In this case the automaton corresponding to $A_P$(never {EOE}) is returned to the parent node in the syntax tree of the assertion, similarly to the degenerate case of the rewrite rule.

If the sequence automaton is not degenerate, then a more complex algorithm is applied. First, the automaton is weakly determinized such that it has only one initial state. Then, any incoming edges to the initial state are removed, and outgoing edges from the final states are removed. The automaton must be implemented as a module, for which a result signal is declared. This result signal is then used, complemented, as the symbol of a self-loop on the initial state. This has the effect of keeping the initial state active until at least one occurrence of the sequence has manifested itself. The actual result signal of the eventually! operator corresponds to the output of the initial state's flip-flop. In this manner, no extra states (hence flip-flops) are used. The actual result signal is implemented in automaton form before being returned to eventually!'s parent node. This consists in preparing a two-state automaton where the second state is a final state, the initial state has a true self-loop, and an edge from the initial state to the second state carries a symbol corresponding to the result signal.

When a precondition automaton is passed to the eventually! node in the recursive compilation, the precondition automaton is implemented as a module, for which a result signal is declared. This signal constitutes the precondition signal for the eventually! automaton. Each time the precondition is asserted, the occurrence matching automaton for eventually! is flushed, with the start and final state's edges modified as described previously. Automaton flushing consists in deactivating the edges for all states except the initial state. This is accomplished by AND-ing a negated literal of the precondition signal to each outgoing edge symbol of each non-initial state. In this manner, each new precondition guarantees a new complete obligation. The precondition automaton used in this technique implies that the recursive mechanism with precondition automata must be used.

Here is an example of the efficient eventually! strategy for the following property:

always (a->eventually! {b;c;d})

The property is actually implemented as two automata, and the automaton at the top right in the figure is returned by the always node in the compilation tree. Since the always property is the argument of the assert directive, the returned automaton is directly implemented in RTL. The grey state also serves as the memory state, which is deactivated once the obligation is fulfilled (once the sequence occurred). Automaton flushing is also visible with the added "~s2" literals. If the always property was part of a more complex assertion, the returned automaton would be used by the parent property to continue to build the complete automaton for the assertion.

Automata splitting and the addition of separate logic gates could also be used for performing efficient automata negation by avoiding the determinization step. In hardware, an NFA could be easily negated by adding a not gate to the output signal of the NFA; however, because the not-gate is not part of the automaton formalism, further automaton operations such as concatenation would be undefined.

Full Automaton Approach

The present invention also updates the tool to consolidate a full automaton approach with the two debug enhancements introduced above which require recursive mechanism #2, namely assertion threading and activity monitoring.

For full automata assertion threading (FIG. 14), a dispatcher circuit (not shown) could be represented in automaton form, but would require more hardware than the custom circuit described previously. At the output side of the threads, the or-gate would not be required since each thread's finals states would serve their traditional purpose. In the current form, the or-gate is used because a result signal must be declared at the back-end of the threads, in order to allow the merging of the thread modules, and to return a proper automaton to the parent node (two-state automaton in FIG. 14).

For full automata activity monitoring, a special tag on states could be devised so that each sub-expression which is to be monitored would have its corresponding states in the automaton tagged with a given group number. These group numbers would serve two purposes: a) to force minimization and other algorithms to retain the integrity of the sub-automaton in question, so that monitoring can be done properly, b) to partition and identify different activity signals for different portions of an assertion.

In the tool of the present invention, when the user sets the "full automaton" switch, the checker generator will compile each assertion and cover statement into a single automaton, before translating to circuit form. Currently, for this to be possible, the tool deactivates assertion threading and activity monitors if they were active, and reverts to the rewrite rule implementation of the eventually! operator.

Implementation of Automata in Hardware

The present invention also provides for transforming automata into circuit form. The resulting HDL circuit descriptions become the checkers that are responsible for monitoring the behavior that is modeled by the assertions. The procedure described in hereinafter defines the operator H(A), which represents the creation of HDL code from a given argument, which in this case is an automaton. If b is a PSL Boolean, the notation H(b) is also valid and will be used in the automaton implementation of Booleans. The resulting circuit descriptions from H( ) become the checkers that are responsible for monitoring the behavior expressed by the assertions.

Implementing an automaton in RTL is performed using the following encoding strategy for each state:

A state signal is defined as a Boolean disjunction of the edge signals that hit a given state;

An edge signal is a Boolean conjunction of the expression represented by the edge's symbol with the sampled state signal from which the edge originates;

A state signal is sampled by a flip-flop, and the flip-flip's output is referred to as the sampled state signal;

If a state is an initial state, the flip-flop defined in step 3 is initially set, else it is initially reset;

The assertion signal (or checker output) is a Boolean disjunction of the state signals of all the final states.

In sum, automata are implemented in hardware using combinational logic and flip-flops. The flip-flops have the additional property that they can be reset by the global reset signal. This way, when the circuit under verification is reset, the checkers can also be reset to provide the correct monitoring. Expressing the RTL circuit as HDL code in the desired language, or even in schematic form, follows naturally. The following example shows how automata are converted to circuit form to produce circuit-level assertion checkers.

A following bus arbiter assertion states that when the request (req) signal goes high, the arbiter should give a bus grant (gnt) within at most three cycles, and req must be kept high until (but not including) the cycle where the grant is received.

assert always {~req; req.}|=>{req[*0:2]; gnt}.

Figure 16:
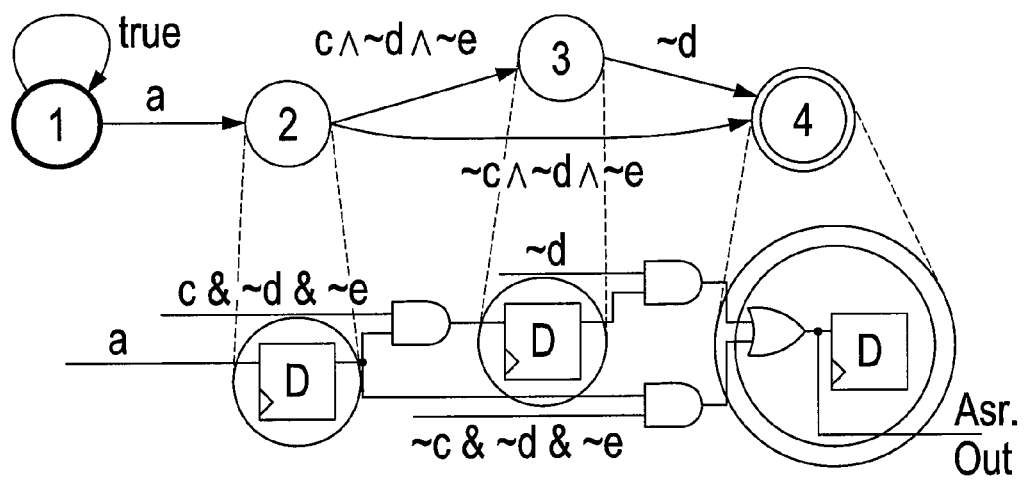
FIG. 16 depicts a circuit-level checker.

The example assertion is compiled into the automaton shown at the top of FIG. 16. The automaton is then expressed in RTL as the circuit shown in the bottom of the figure. The labels containing Boolean expressions can also be expressed using logic circuits, but are kept in text form for simplicity in this example. The always operator has the effect of creating the self loop on state 1, which continually activates the automaton in search of a faulty trace. This state is optimized away given that it is an initial state and that the true self-loop perpetually keeps it active.

By default a flip-flop is added to the assertion signal to improve the frequency performance of the checker. This is particularly useful when a checker has many final states or when final states have many incoming edges. The flip-flop is also beneficial when the assertion signal is routed to a pin or a register file elsewhere on the circuit being tested. The checker should interfere as little as possible with the source design's timing, and the flip-flop helps reduce the chance that the assertion signals are on the critical path. The penalty is a one-cycle delay in the response of the checker. The FF can be avoided by using the appropriate switch in the checker generator, when desired.

To recap, implementing an automaton in hardware is done in two parts. First, each state signal is sampled by a flip-flop (FF). The FF's output is referred to as the sampled state-signal. Second, a state signal is defined as a disjunction of the edge signals that hit a given state. An edge signal is a conjunction of the edge's symbol with the sampled state signal from which the edge originates. The signal which is returned by the automaton, called result signal, is a disjunction of the state signals of the final states (as opposed to the sampled state signals). This is an important distinction because when the automaton represents the left side of a non-overlapping temporal implication, for example, this result signal is used as the start condition for the right side, which must start immediately when the start condition is detected. Another example of this procedure is shown in FIG. 15.

Figure 15:
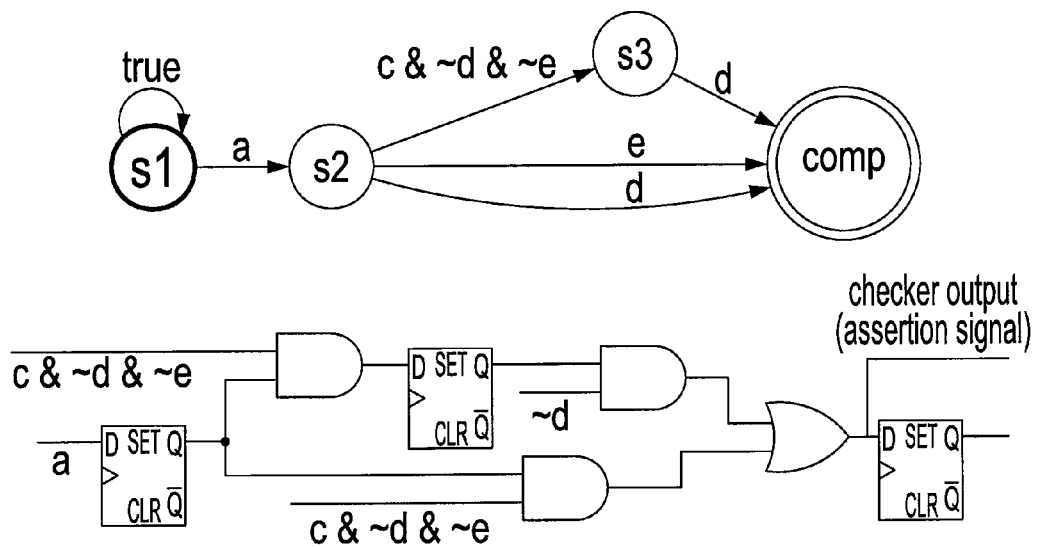
FIG. 15 illustrates the translation of assertion automaton into circuit form, ex: assert always ({a}|=>{{c[*0:1];d}|{e}})

FIG. 15 also illustrates the translation of assertion automaton into circuit form, ex: assert always ({a}|=>{{c[*0:1]; d}|{e}}). Flip-flops for states s2, s3 and comp are visible in the circuit, while the flip-flop for s1 was optimized away.

When the automaton representing an assertion reaches a final state, an assertion violation has been found (except in completion mode, where a success has been found). The start state is the only active state when reset is released. If this state has no incoming edges, then the input is logic-0 and the flip-flop will de-assert on the next clock cycle. This is consistent with the behavior required for implementing assertions of the form "assert a;", for which a must only be checked on the first cycle after reset is released.

Weak determinism, or any non-determinism in automata is well suited for hardware implementations given the parallel nature of the circuits. For implementations requiring deterministic behavior, the automata produced by the algorithms of the present invention could be made strongly deterministic by applying the StrongDeterminize( ) algorithm shown further.

Example uses of Checkers

Figure 17:
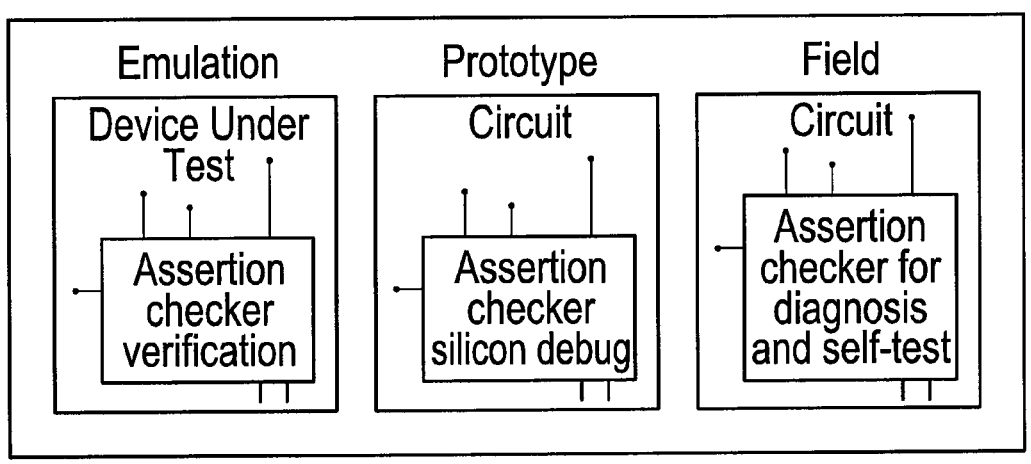
FIG. 17 illustrates different usage scenarios for hardware assertion checkers.

Efficient circuit-level assertion checkers generated by the present tool can be used in a variety of contexts, three of which are outlined in FIG. 17. These contexts are: 1) checkers are used in the verification stage when the design is to be simulated, emulated in hardware or executed on a simulation accelerator; 2) checkers are used to perform post-fabrication in-circuit debugging; and 3) in-field custom circuits for in-chip diagnosis and self test. In contexts 2 and 3, the circuits are a permanent addition to the IC, and in verification they can be temporary.

The present invention can be used to easily add support for assertions within simulators that do not support assertions. By automatically creating Register Transfer Level (RTL) assertion checker circuits, as described in this invention, such checker circuits can be directly added to the design under simulation, which precludes having to program the monitoring of assertion statements in the simulator's kernel (a non-trivial task).

Silicon debugging is the task of verifying and bug-fixing a post-fabricated IC. Assertion checkers produced by the tool of the present invention can not only be used for emulation and simulation verification before fabrication, but also post-fabrication, when a set of assertion checkers are purposely left in the design. The checkers can test for functionality as well as timing issues which can not be fully tested pre-fabrication. Connecting the checker outputs to the proper lab equipment, or to on-board read-back circuitry, the user can get immediate feedback on assertion failures and start the debugging process. The numerous debug enhancements can also be added for more insightful debugging. A checker generator capable of producing resource-efficient checkers is obviously an advantage when checkers take up valuable silicon real-estate.

The checkers mentioned above for silicon debugging serve their purpose, but can be removed for production quantity re-spins. In another usage scenario, assertion checkers can be an integral part of any design which attempts to assess its operating conditions in real-time. Run-time assertion checker monitoring could be performed, and the results of checkers analyzed by an on-board CPU which could then send regular status updates off-chip. Real-time diagnosis based on in-circuit checkers can be especially important in mission-critical environments. For example, if a multitude of assertion checkers running concurrently with the device were to detect an error, a secondary redundant system could be instantly activated.

In another usage scenario, the expressive power of assertions, combined with a strong checker generator can be used to perform explicit circuit design. This is not unlike the "production based specification" project which was only based on regular expressions. In the context of the present invention, any sort of monitoring circuit, which can be expressed by an assertion, one fed into the checker generator, would produce a complex, error-free circuit instantly. Once implemented in circuit form, these checkers are in fact more akin to actual design modules, rather than verification modules. An example where this technique could be utilized is in the design of certain portion of BIST circuitry (Built-In Self Test). The exercising logic may not always be possible to design using assertions, however, any monitoring and analysis circuitry could benefit directly from the previously described techniques for circuit design using the tool of the present invention. The high-level expressiveness of an assertion language combined with an assertion compiler can be used as a quick method to automatically design HDL circuits.

Experimental Results

In the following tables, the tool of the present invention is benchmarked using a variety of assertions. The circuits generated by the tool are synthesized for an XC2V1500-6 FPGA from Xilinx™, using the XST 6.2.03i synthesis tool (FF: # flip-flops, LUT: # lookup tables, MHz is max frequency) Without loss of generality, complex Boolean layer expressions are represented using simple Boolean primitives (a, b, c etc.); these change nothing to the temporal complexity of assertions (and hence checkers), which is the principal metric of interest.

TABLE 1

Resource usage of checkers, miscellaneous examples.

| Assertions | Invention | | |
|---|---|---|---|
| "assert x;" where x is: | FF | LUT | MHz |
| always {start} |=> {busy[*0:7];ready1;ready2} | 17 | 27 | 296 |
| always (req -> {[*0:7];grant}) abort ~reset | 8 | 9 | 680 |
| always {start} |-> next_event_a!(flag)[1:3](~reset) | 4 | 5 | 483 |
| always {a} |=> {{{c[*1:2];d}[+]} && {{e[->2:3]}; d}} | 16 | 39 | 349 |
| always ({a;b} |-> eventually! {c;d}) abort e | 4 | 8 | 483 |
| always {a} |=> {{{b;c[*1:2];d}[+]} : {b;{e[->2:3]}; d}} | 65 | 192 | 255 |
| always ( ({a;d} |-> next_e[2:4](b)) until c ) | 6 | 6 | 680 |
| never { {{b;c[*1:2];d}[+]} && {b;{e[->2:3]};d} } | 16 | 20 | 422 |
| never { {e;e} within {c;d;a;b;c} } | 11 | 11 | 622 |
| always (e || (a -> ({b;c} until d))) | 3 | 5 | 487 |
| never {a;d;{b;a}[*2:4];c;d} | 12 | 12 | 622 |

TABLE 1-continued

Resource usage of checkers, miscellaneous examples.

| Assertions "assert x;" where x is: | Invention FF | LUT | MHz |
|---|---|---|---|
| always {a;b;c} |=> never {d[*0:3];e} | 7 | 8 | 487 |
| never { {a;[*];b} && {c[*1:5];d} } | 6 | 8 | 487 |
| always ( (a -> (b before c)) && (c -> eventually! {b;d}) ) abort e | 4 | 8 | 508 |
| always a -> ({b;c} until! d) | 3 | 7 | 512 |
| always {a;b[*0:2];c} |=> ({d[*2]} |-> next ~e) | 7 | 7 | 622 |
| always (a -> ( (eventually! b[*5]) abort c) ) abort d | 6 | 9 | 521 |
| always {a} |=> { {{b;c[*1:2];d}[+]} : {{e[->]};d} } | 22 | 58 | 317 |
| always { req & rdy } |-> {~gt ; {bsy & ~gt}[*0:4] ; gt & ~bsy} | 6 | 10 | 487 |

TABLE 2

Resource usage of checkers, without and with activity monitors.

| Assertions "assert x;" where x is: | invention | | | Invention + Act.Mon. | | |
|---|---|---|---|---|---|---|
|  | FF | LUT | MHz | FF | LUT | MHz |
| always { r & d } |-> {~g ; {b & ~g}[*0:4] ; g & ~b} | 6 | 10 | 487 | 7 | 11 | 487 |
| always ({a;b} |=> {c[*0:1];d}) | 4 | 4 | 622 | 4 | 6 | 616 |
| always ({a} |=> {{c[*0:1];d}|{e}}) | 3 | 4 | 622 | 4 | 5 | 622 |
| never {a;d;{b;a}[*2:4];c;d} | 12 | 12 | 622 | 12 | 16 | 616 |
| always {a} |=> {e;d;{b;e}[*2:4];c;d} | 15 | 21 | 378 | 16 | 25 | 375 |
| always {a} |=> {b; {c[*0:2]} | {d[*0:2]} ; e} | 7 | 12 | 428 | 8 | 14 | 425 |
| never { {{b;c[*1:2];d}[+]} && {b;{e[->2:3]};d} } | 16 | 20 | 422 | 16 | 25 | 419 |
| always {a} |=> {{{c[*1:2];d}[+]} && {{e[->2:3]};d}} | 16 | 39 | 349 | 18 | 44 | 337 |
| always {a}|=>{{{b;c[*1:2];d}[+]} & {b;{e[->2:3]};d}} | 44 | 127 | 269 | 45 | 136 | 268 |
| always{a}|=>{{{b;c[*1:2];d}[+]}&&{b;{e[->2:3]};d}} | 35 | 112 | 258 | 36 | 119 | 270 |

TABLE 3

Resource usage of checkers, in normal versus completion mode.

| Assertions "assert x;" where x is: | Normal | | | Asr. Completion | | |
|---|---|---|---|---|---|---|
|  | FF | LUT | MHz | FF | LUT | MHz |
| always { r & d } |-> {~g ; {b & ~g}[*0:4] ; g & ~b} | 6 | 10 | 487 | 6 | 8 | 487 |
| always ({a;b} |=> {c[*0:1];d}) | 4 | 4 | 622 | 4 | 4 | 622 |
| always ({a} |=> {{c[*0:1];d}|{e}}) | 3 | 4 | 622 | 3 | 3 | 622 |
| always {a} |=> {e;d;{b;e}[*2:4];c;d} | 15 | 21 | 378 | 15 | 16 | 483 |
| always {a} |=> {b; {c[*0:2]} | {d[*0:2]} ; e} | 7 | 12 | 428 | 7 | 10 | 425 |
| always {{{b;c[*1:2];d}[+]} : {b;{e[->]};d}} |=> next a | 8 | 8 | 487 | 8 | 8 | 487 |
| always {a} |=> {{{c[*1:2];d}[+] && {{e[->2:3]};d}} | 16 | 39 | 349 | 16 | 31 | 339 |
| always {a}|=>{{{b;c[*1:2];d}[+] & {b;{e[->2:3]};d}} | 44 | 127 | 269 | 44 | 127 | 269 |
| always{a}|=>{{{b;c[*1:2];d}[+]}&&{b;{e[->2:3]};d}} | 35 | 112 | 258 | 35 | 96 | 299 |

TABLE 4

Resource usage of checkers with assertion threading.

| Assertions | None | | | 2-way | | | 4-way | | | 8-way | | |
|---|---|---|---|---|---|---|---|---|---|---|---|---|
|  | FF | LUT | MHz | FF | LUT | MHz | FF | LUT | MHz | FF | LUT | MHz |
| A1 | 6 | 10 | 487 | 15 | 19 | 378 | 29 | 38 | 300 | 57 | 69 | 258 |
| A2 | 12 | 12 | 622 | 25 | 24 | 622 | 49 | 47 | 521 | 97 | 93 | 448 |
| A3 | 15 | 21 | 378 | 33 | 46 | 326 | 65 | 85 | 273 | 129 | 176 | 236 |
| A4 | 16 | 20 | 422 | 33 | 40 | 422 | 65 | 79 | 422 | 129 | 156 | 355 |
| A5 | 26 | 76 | 278 | 57 | 150 | 267 | 113 | 290 | 233 | 225 | 579 | 223 |
| A6 | 35 | 112 | 258 | 73 | 224 | 242 | 145 | 445 | 227 | 289 | 856 | 198 |
| A1 = | assert always { req & rdy } |-> {~gt ; {bsy & ~gt}[*0:4] ; gt & ~bsy}; | | | | | | | | | | | |

TABLE 4-continued

Resource usage of checkers with assertion threading.

|  | None | | | 2-way | | | 4-way | | | 8-way | | |
|---|---|---|---|---|---|---|---|---|---|---|---|---|
| Assertions | FF | LUT | MHz | FF | LUT | MHz | FF | LUT | MHz | FF | LUT | MHz |
| A2 = | assert never {a;d;{b;a}[*2:4];c;d}; | | | | | | | | | | | |
| A3 = | assert always {a} \|=> {e;d;{b;e}[*2:4];c;d}; | | | | | | | | | | | |
| A4 = | assert never { {{b;c[*1:2];d}[+]} && {b;{e[->2:3]};d} }; | | | | | | | | | | | |
| A5 = | assert always {a} \|=> {{{b;c[*1:2];d}[+]} : {b;{e[->]};d}}; | | | | | | | | | | | |
| A6 = | assert always {a} \|=> { {{b;c[*1:2];d}[+]} && {b;{e[->2:3]};d} }; | | | | | | | | | | | |

Algorithms

The various algorithms previously described are being documented hereinafter, as implemented for the above experiment.

```
 1: FUNCTION: INTERSECT(A₁, A₂)
 2: A₁ ← WEAKDETERMINIZE(A₁);
 3: A₂ ← WEAKDETERMINIZE(A₂);
 4: //here |I₁|=|I₂|=1;i.e. I₁ = {i₁}, I₂ = {i₂}
 5: //a label is an ordered pair (u, v) | u ∈ Q₁, v ∈ Q₂
 6: create new state q labeled with (i₁, i₂)
 7: create new automaton A = ({q}, ∅, {q}, ∅)    //Q, δ, I, F
 8: add q to an initially empty set C    //C is "to-construct"
 9: while C ≠ ∅ do
10:    remove a state r (with its label (u, v)), from C
11:    if u ∈ F₁ and v ∈ F₂ then
12:       F ← F ∪ {r}
13:    for each edge (s₁, σ₁, d₁) ∈ δ₁ | s₁ = u do
14:       for each edge (s₂, σ₂, d₂) ∈ δ₂ | s₂ = v do
15:          find state t ∈ Q with label (d₁, d₂)
16:          if ∄t then
17:             create new state t ∈ Q labeled with (d₁, d₂)
18:             C ← C ∪ {t}
19:          σ ← create or retrieve symbol in Σ for σ₁ ∧ σ₂
20:          δ ← δ ∪ {(r, σ, t)}
21: return A
```

```
1: FUNCTION: FUSE(A_L, A_R)
2: create new automaton A = (Q_L ∪ Q_R, δ_L ∪ δ_R, I_L, F_R)    //Q, δ, I, F
3: for each edge (s_L, σ_L, d_L) ∈ δ_L | d_L ∈ F_L do
4:    for each edge (s_R, σ_R, d_R) ∈ δ_R | s_R ∈ I_R do
5:       σ ← create or retrieve symbol in Σ for σ_L ∧ σ_R
6:       if EOE signal ∉ σ's primary symbols then
7:          δ ← δ ∪ {(s_L, σ_L, d_R)}
8: return A
```

```
 1: FUNCTION: FIRSTFAIL(A)    //Q, δ, I, F
 2: if I ∩ F ≠ ∅ then
 3:    create new automaton A₁ = ({q₁}, ∅, {q₁}, ∅)
 4: else
 5:    A₁ ← STRONGDETERMINIZE(A)
 6:    add a new state q_f to Q₁  //q_f used as the fail state
 7:    for each state q_i ∈ Q₁ − {q_f} do
 8:       create set of primary symbols P = ∅
 9:       for each edge (s, σ, d) ∈ δ₁ | s = q_i do
10:          add σ's primary symbol(s) to P
11:       if P ≠ ∅ then
12:          for each assignment w of primary symbols in P do
13:             if ∄(s, σ, d) ∈ δ₁ | s = q_i, (σ)_w = true then
14:                σ ← create or retrieve symbol in Σ for w
15:                δ₁ ← δ₁ ∪ {(q_i, σ, q_f)}
16:       else
17:          σ ← create or retrieve existing symbol in Σ for true
18:          δ₁ ← δ₁ ∪ {(q_i, σ, q_f)}
19:       remove all edges (s_j, σ_j, d_j) ∈ δ₁ for which d_j ∈ F₁
20:       F₁ ← {q_f}
21: return A₁  //|F₁| ≤ 1, as required for FIRSTFAILSTRONG( )
```

```
1: FUNCTION: FIRSTFAILSTRONG(A)
2: A ← FIRSTFAIL(A)    //(Q, δ, I, F)
3: //here |F| ≤ 1
4: if |F| = 1 (i.e. F = {f}) then
5:    σ_n ← create or retrieve symbol in Σ for the EOE signal
6:    for each state q ∈ Q do
7:       δ ← δ ∪ {(q, σ_n, f)}
8: return A
```

```
1: FUNCTION: FIRSTMATCH(A)
2: A ← STRONGDETERMINIZE(A)
3: remove all edges (s_j, σ_j, d_j) ∈ δ for which s_j ∈ F
4: return A
```

```
 1: FUNCTION: MINIMIZE(A)
 2: A ← REVERSE(A)
 3: A ← WEAKDETERMINIZE(A)
 4: COLLAPSEFINALSTATES(A)
 5: A ← REVERSE(A)
 6: A₂ ← WEAKDETERMINIZE(A)
 7: if |Q₂| < |Q| then
 8:    A ← A₂
 9:    COLLAPSEFINALSTATES(A)
10: return A
```

```
1: FUNCTION: CONCATENATE(A_L, A_R)
2: create new automaton A = (Q_L ∪ Q_R, δ_L ∪ δ_R, I_L, F_R)    //Q, δ, I, F
3: for each state f_L ∈ F_L do
4:    for each edge (s_R, σ_R, d_R) ∈ δ_R | s_R ∈ I_R do
5:       δ ← δ ∪ {(f_L, σ_R, d_R)}
6:       if s_R ∈ F_R then
7:          F ← F ∪ {f_L}
8: return A
```

```
1: FUNCTION: CHOICE(A₁, A₂)
2: return new automaton A = (Q_L ∪ Q_R, δ_L ∪ δ_R, I_L ∪ I_R, F_L ∪ F_R)
```

```
 1: FUNCTION: KLEENECLOSURE(A)
 2: create transition relation δ₁ = ∅
 3: for each edge (s, σ, d) ∈ δ | d ∈ F do
 4:     for each state i ∈ I do
 5:         δ₁ ← δ₁ ∪ {(s, σ, i)}
 6: δ ← δ ∪ δ₁
 7: F ← F ∪ I
 8: return A
```

```
 1: FUNCTION: WEAKDETERMINIZE(A)
 2: //a label is a totally ordered set T ⊆ Q
 3: apply total order to I
 4: create new state q labeled with I
 5: create new automaton A_D = ({q}, ∅, {q}, ∅)   //Q_D, δ_D, I_D, F_D
 6: add q to an initially empty set C   //C is "to-construct"
 7: while C ≠ ∅ do
 8:     remove a state r (with its label T), from C
 9:     if T ∩ F ≠ ∅ then
10:         F_D ← F_D ∪ {r}
11:     create set of extended symbols E = ∅
12:     for each edge (s, σ, d) ∈ δ | s ∈ T do
13:         add σ to E
14:     for each extended symbol σ_i in E do
15:         create a new label U = ∅
16:         for each edge (s, σ, d) ∈ δ | s ∈ T, σ = σ_i do
17:             U ← U ∪ {d}
18:         if U ≠ ∅ then
19:             find state u ∈ Q_D with label U
20:             if ∄u then
21:                 create new state u ∈ Q_D labeled with U
22:                 C ← C ∪ {u}
23:             //
24:             δ_D ← δ_D ∪ {(r, σ_i, u)}
25: return A_D   //|I_D|=1, as required for INTERSECT( )
```

```
 1: FUNCTION: FORALLRANGE(low, high, ident, p)
 2: create new automaton A = A^P ((p)_{ident←low})
 3: for i ← low + 1 to high do
 4:     A ← CHOICE (A, A^P ((p)_{ident←i}))
 5: return A
```

```
 1: FUNCTION: ADDLITERAL(A, H)
 2: σ_l ← create or retrieve symbol in Σ for H
 3: for each edge (s, σ, d) ∈ δ do
 4:     σ_n ← create or retrieve symbol in Σ for σ ∧ σ_l
 5:     (s, σ, d) ← (s, σ_n, d)
 6: return A
```

```
 1: FUNCTION: STRONGDETERMINIZE(A)
 2: //a label is a totally ordered set T ⊆ Q
 3: apply total order to I
 4: create new state q labeled with I
 5: create new automaton A_D = ({q}, ∅, {q}, ∅)   //Q_D, δ_D, I_D, F_D
 6: add q to an initially empty set C   //C is "to-construct"
 7: while C ≠ ∅ do
 8:     remove a state r (with its label T), from C
 9:     if T ∩ F ≠ ∅ then
10:         F_D ← F_D ∪ {r}
11:     create set of primary symbols P = ∅
12:     for each edge (s, σ, d) ∈ δ | s ∈ T do
13:         add σ's primary symbol(s) to P
14:     for each assignment w of primary symbols in P do
15:         create a new label U = ∅
```

-continued

```
16:         for each edge (s, σ, d) ∈ δ | s ∈ T, (σ)_w = true do
17:             U ← U ∪ {d}
18:         if U ≠ ∅ then
19:             find state u ∈ Q_D with label U
20:             if ∄u then
21:                 create new state u ∈ Q_D labeled with U
22:                 C ← C ∪ {u}
23:             σ_i ← create or retrieve symbol in Σ for w
24:             δ_D ← δ_D ∪ {(r, σ_i, u)}
25: return A_D
```

```
 1: FUNCTION: REVERSE(A)   //(Q, δ, I, F)
 2: if F = ∅ then
 3:     create new automaton A₁ = ({q₁}, ∅, {q₁}, ∅)
 4: else
 5:     create new automaton A₁ = (Q, δ, F, I)
 6:     for each edge (s, σ, d) ∈ δ₁ do
 7:         (s, σ, d) ← (d, σ, s)
 8: return A₁
```

```
 1: FUNCTION: COLLAPSEFINALSTATES(A)   //(Q, δ, I, F)
 2: while ∃ pair of edges (s₁, σ₁, d₁) and (s₂, σ₂, d₂) | d₁ = s₂ = d₂, σ₁ = σ₂ =true,
        σ₂, d₂) | d₁ = s₂ = d₂, σ₁ = σ₂ =true,
        {s₁, s₂, d₁, d₂} ⊆ F do
 3:     for each edge (s₃, σ₃, d₃) | s₃ = s₁ do
 4:         δ ← δ - {(s₃, σ₃, d₃)}
 5:         δ ← δ ∪ {(s₁, σ₁, s₁)}
 6: return A
```

```
 1: FUNCTION: NEGATE(A)
 2: A ← STRONGDETERMINIZEWITHCOMPLETION(A)   //Q, δ, I, F
 3: F ← Q - F
 4: return A
```

```
 1: FUNCTION: RANGEREPEAT(low, high, A)
 2: if high = 0 then   //high ≥ low is assumed
 3:     create new automaton A₁ = ({q₁}, ∅, {q₁}, {q₁})   //Q₁, δ₁, I₁, F₁
 4: else
 5:     create new automaton A₁ = A
 6:     for i ← 2 to high do
 7:         A₁ ← CONCATENATE(A₁, A)
 8:         if i ≤ (high - low + 1) then
 9:             I₁ ← I₁ ∪ {s | s ∈ Q₁, s was in I (in A) before the concatenation}
10:     if low = 0 then
11:         F₁ ← F₁ ∪ I₁
12: return A₁
```

```
 1: FUNCTION: BASECASE(H)
 2: H ← remove outermost negations from H
 3: π ← create or retrieve existing symbol in Π for H
 4: if odd number of outermost negations were removed in line 2 then
 5:     σ ← create or retrieve existing symbol in Σ for ¬π
 6: else
 7:     σ ← create or retrieve existing symbol in Σ for π
 8: return new automaton A = ({q₁, q₂}, {(q₁, σ, q₂)}, {q₁}, {q₂})
```

Although the present invention has been described as various embodiments and in some instances in greater details using known protocols for exemplary purposes, the latter is not limited to such embodiments or protocols, but rather by the scope of protection defined in the following claims.

The invention claimed is:

1. A method of manufacturing hardware circuitry, the method comprising:

specifying assertions corresponding to an expected behaviour of a circuit using an assertion language for subsequent retrieval by a computer system;

defining within the computer system symbol encoding and optimizations for Boolean expressions in said assertions, the symbol encoding and optimizations for subsequent use in automaton form as automata;

converting with the computer system said assertions into automata, whereby at least portions of a predetermined subset of the automata are nondeterministic;

adapting the generated automata with a threading unit to further allow tracking complex temporal chains of events of the expected behaviour;

using said automata, combined with traditional circuitry, to design checker circuitry with the computer system; and implementing in hardware said checker circuitry.

2. The method as claimed in claim 1, further comprising testing the checker circuitry using at least one of hardware emulation, in-silicon debugging, simulation and infield diagnosis.

3. The method as claimed in claim 1, wherein said encoding comprises using top-level positive Boolean expressions and symbol tables to encode top-level negations, in order to minimize number of states in said automata, along with specialized automata and symbol processing techniques for said encoding.

4. The method as claimed in claim 1, wherein the conversion process determines which portions of the predetermined subset of the automata are nondeterministic.

5. The method as claimed in claim 1, wherein said automata are recursively constructed using mechanisms where at least one of parent nodes and child nodes assemble sub-automata during checker generation in a syntax tree.

* * * * *